US009568527B2

(12) United States Patent
Buttolo et al.

(10) Patent No.: US 9,568,527 B2
(45) Date of Patent: Feb. 14, 2017

(54) PROXIMITY SWITCH ASSEMBLY AND ACTIVATION METHOD HAVING VIRTUAL BUTTON MODE

(71) Applicant: Ford Global Technologies, LLC, Dearborn, MI (US)

(72) Inventors: Pietro Buttolo, Dearborn Heights, MI (US); Stuart C. Salter, White Lake, MI (US); Dipanjan Ghosh, Dearborn Heights, MI (US); Khaled Omar, Dearborn, MI (US); James Stewart Rankin, II, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 218 days.

(21) Appl. No.: 14/168,614

(22) Filed: Jan. 30, 2014

(65) Prior Publication Data

US 2014/0145733 A1    May 29, 2014

Related U.S. Application Data

(63) Continuation-in-part of application No. 13/444,393, filed on Apr. 11, 2012, now Pat. No. 8,933,708.

(51) Int. Cl.
G01R 27/26 (2006.01)
H03K 17/955 (2006.01)

(52) U.S. Cl.
CPC ......... *G01R 27/2605* (2013.01); *H03K 17/955* (2013.01); *H03K 2217/94052* (2013.01); *H03K 2217/960705* (2013.01)

(58) Field of Classification Search
CPC .......... G01R 27/2605; G01D 5/24; G01L 9/12
See application file for complete search history.

(56) References Cited

U.S. PATENT DOCUMENTS 3,382,588 A    5/1968 Serrell et al.
3,544,804 A    12/1970 Gaumer et al.
(Continued)

FOREIGN PATENT DOCUMENTS

DE    4024052    1/1992
EP    1152443    11/2001
(Continued)

OTHER PUBLICATIONS

U.S. Appl. No. 14/518,141, filed Oct. 20, 2014, entitled "Directional Proximity Switch Assemby," (23 pages of specification and 13 pages of drawings) and Official Filing Receipt (3 pages).
(Continued)

*Primary Examiner* — Tung X Nguyen
*Assistant Examiner* — Dominic Hawkins
(74) *Attorney, Agent, or Firm* — Vichit Chea; Price Heneveld LLP

(57) ABSTRACT

A proximity switch assembly and method for detecting activation of a proximity switch assembly is provided. The assembly includes a plurality of proximity switches each having a proximity sensor providing a sense activation field and control circuitry processing the activation field of each proximity switch to sense activation. The control circuitry controls the activation field of each proximity switch to sense activation, monitors signals indicative of the activation field, and determines a first stable signal amplitude and a subsequent second signal amplitude, and generates an activation output when the second stable signal amplitude exceeds the first stable amplitude by a known amount.

20 Claims, 15 Drawing Sheets

(56) References Cited

U.S. PATENT DOCUMENTS

| | | |
|---|---|---|
| 3,671,750 A | 6/1972 | Heitmann et al. |
| 3,691,396 A | 9/1972 | Hinrichs |
| 3,707,671 A | 12/1972 | Morrow et al. |
| 3,725,589 A | 4/1973 | Golden |
| 3,826,979 A | 7/1974 | Steinmann |
| 3,950,748 A | 4/1976 | Busy |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,370,646 A * | 1/1983 | Mahony ............... G09G 1/162 345/20 |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,225,959 A | 7/1993 | Stearns |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,367,199 A | 11/1994 | Lefkowitz et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,015 A * | 8/1998 | Iitsuka ............... B60R 25/1001 180/287 |
| 5,790,107 A | 8/1998 | Kasser et al. |
| 5,796,183 A | 8/1998 | Hourmand |
| 5,801,340 A | 9/1998 | Peter |
| 5,825,352 A | 10/1998 | Bisset et al. |
| 5,827,980 A | 10/1998 | Doemens et al. |
| 5,844,287 A | 12/1998 | Hassan et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 5,982,608 A | 11/1999 | Kalnitsky et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,047,964 A * | 4/2000 | Lawandy ............... A63F 3/0685 273/138.1 |
| 6,075,460 A | 6/2000 | Minissale et al. |
| 6,140,914 A * | 10/2000 | Mueller ............... B60R 25/1003 340/426.13 |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,259,045 B1 * | 7/2001 | Imai ............... H01H 13/70 200/5 A |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,438,257 B1 | 8/2002 | Morimura et al. |
| 6,445,192 B1 * | 9/2002 | Lovegren ............... G01F 23/284 324/644 |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,239 B1 | 12/2003 | Ozick |
| 6,661,410 B2 | 12/2003 | Casebolt et al. |
| 6,664,489 B2 | 12/2003 | Kleinhans et al. |
| 6,713,897 B2 | 3/2004 | Caldwell |

(56) References Cited

U.S. PATENT DOCUMENTS

| | | | |
|---|---|---|---|
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 * | 9/2004 | Kithil | B60H 1/00742 257/532 |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,943,705 B1 | 9/2005 | Bolender et al. |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,178,405 B2 | 2/2007 | Sato |
| 7,180,017 B2 | 2/2007 | Hein |
| 7,186,936 B2 | 3/2007 | Marcus et al. |
| 7,205,777 B2 * | 4/2007 | Schulz | E05B 81/78 307/10.1 |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,279,647 B2 | 10/2007 | Philipp |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,593 B2 * | 4/2008 | Hill | G06F 3/0428 345/169 |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,518,381 B2 * | 4/2009 | Lamborghini | B60K 37/06 324/658 |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,576,611 B2 | 8/2009 | Glaser |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,654,147 B2 * | 2/2010 | Witte | E05B 81/78 73/760 |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,720,611 B2 | 5/2010 | Lerner |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,076,949 B1 * | 12/2011 | Best | G06F 3/044 324/663 |
| 8,077,154 B2 | 12/2011 | Emig et al. |
| 8,090,497 B2 | 1/2012 | Ando |
| 8,253,425 B2 | 8/2012 | Reynolds et al. |
| 8,269,724 B2 | 9/2012 | Sakurai et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 * | 6/2013 | Sitarski | H03K 17/955 324/601 |
| 8,508,487 B2 | 8/2013 | Schwesig et al. |
| 8,514,185 B2 | 8/2013 | Hotelling |
| 8,517,383 B2 | 8/2013 | Wallace et al. |
| 8,537,107 B1 | 9/2013 | Li |
| 8,558,346 B1 | 10/2013 | Cheng et al. |
| 8,570,053 B1 | 10/2013 | Ryshtun et al. |
| 8,575,949 B2 | 11/2013 | Salter et al. |
| 8,599,144 B2 | 12/2013 | Peng et al. |
| 8,619,058 B2 | 12/2013 | Ito et al. |
| 8,659,414 B1 | 2/2014 | Schuk |

(56) References Cited

U.S. PATENT DOCUMENTS

| | | | |
|---|---|---|---|
| 8,688,330 B2* | 4/2014 | Werner | E05B 85/01 318/272 |
| 8,724,038 B2 | 5/2014 | Ganapathi et al. | |
| 8,736,577 B2* | 5/2014 | Land | G06F 3/0418 178/18.01 |
| 8,816,967 B2 | 8/2014 | Lyon et al. | |
| 8,908,034 B2 | 12/2014 | Bordonaro | |
| 8,933,708 B2 | 1/2015 | Buttolo et al. | |
| 8,981,265 B2 | 3/2015 | Jiao et al. | |
| 9,088,282 B2* | 7/2015 | Holenarsipur | H03K 17/955 |
| 9,110,111 B1* | 8/2015 | Kapila | G01R 29/26 |
| 9,143,127 B2 | 9/2015 | Tamura et al. | |
| 9,152,278 B2* | 10/2015 | Kent | G06F 3/0418 |
| 9,182,837 B2 | 11/2015 | Day | |
| 9,274,652 B2 | 3/2016 | Chang et al. | |
| 9,372,538 B2* | 6/2016 | Pala | G06F 3/0414 |
| 2001/0019228 A1 | 9/2001 | Gremm | |
| 2001/0028558 A1 | 10/2001 | Rapp et al. | |
| 2002/0040266 A1 | 4/2002 | Edgar et al. | |
| 2002/0084721 A1 | 7/2002 | Walczak | |
| 2002/0093786 A1 | 7/2002 | Maser | |
| 2002/0149376 A1 | 10/2002 | Haffner et al. | |
| 2002/0167439 A1 | 11/2002 | Bloch et al. | |
| 2002/0167704 A1 | 11/2002 | Kleinhans et al. | |
| 2003/0002273 A1 | 1/2003 | Anderson, Jr. et al. | |
| 2003/0063073 A1* | 4/2003 | Geaghan | G06F 3/0416 345/173 |
| 2003/0101781 A1 | 6/2003 | Budzynski et al. | |
| 2003/0122554 A1 | 7/2003 | Karray et al. | |
| 2003/0128116 A1 | 7/2003 | Ieda et al. | |
| 2003/0168271 A1 | 9/2003 | Massen | |
| 2003/0189211 A1 | 10/2003 | Dietz | |
| 2004/0056753 A1 | 3/2004 | Chiang et al. | |
| 2004/0090195 A1 | 5/2004 | Motsenbocker | |
| 2004/0145613 A1 | 7/2004 | Stavely et al. | |
| 2004/0160072 A1 | 8/2004 | Carter et al. | |
| 2004/0160234 A1 | 8/2004 | Denen et al. | |
| 2004/0160713 A1 | 8/2004 | Wei | |
| 2004/0197547 A1 | 10/2004 | Bristow et al. | |
| 2004/0246239 A1 | 12/2004 | Knowles et al. | |
| 2005/0012484 A1 | 1/2005 | Gifford et al. | |
| 2005/0052429 A1 | 3/2005 | Philipp | |
| 2005/0068045 A1 | 3/2005 | Inaba et al. | |
| 2005/0068712 A1 | 3/2005 | Schulz et al. | |
| 2005/0073317 A1* | 4/2005 | Yamamoto | G01R 35/00 324/503 |
| 2005/0073425 A1 | 4/2005 | Snell et al. | |
| 2005/0088417 A1 | 4/2005 | Mulligan | |
| 2005/0092097 A1 | 5/2005 | Shank et al. | |
| 2005/0110769 A1 | 5/2005 | DaCosta et al. | |
| 2005/0137765 A1 | 6/2005 | Hein et al. | |
| 2005/0183508 A1 | 8/2005 | Sato | |
| 2005/0218913 A1 | 10/2005 | Inaba et al. | |
| 2005/0242923 A1 | 11/2005 | Pearson et al. | |
| 2005/0275567 A1 | 12/2005 | DePue et al. | |
| 2005/0283280 A1 | 12/2005 | Evans, Jr. | |
| 2006/0022682 A1 | 2/2006 | Nakamura et al. | |
| 2006/0038793 A1 | 2/2006 | Philipp | |
| 2006/0044800 A1 | 3/2006 | Reime | |
| 2006/0052907 A1* | 3/2006 | Hein | B60K 37/06 701/1 |
| 2006/0055534 A1 | 3/2006 | Fergusson | |
| 2006/0082545 A1 | 4/2006 | Choquet et al. | |
| 2006/0170241 A1 | 8/2006 | Yamashita | |
| 2006/0238518 A1 | 10/2006 | Westerman et al. | |
| 2006/0238521 A1 | 10/2006 | Westerman et al. | |
| 2006/0244733 A1 | 11/2006 | Geaghan | |
| 2006/0250142 A1 | 11/2006 | Abe | |
| 2006/0262549 A1 | 11/2006 | Schmidt et al. | |
| 2006/0267953 A1* | 11/2006 | Peterson, Jr. | G06F 3/0418 345/173 |
| 2006/0279015 A1 | 12/2006 | Wang | |
| 2006/0287474 A1 | 12/2006 | Crawford et al. | |
| 2007/0008726 A1 | 1/2007 | Brown | |
| 2007/0023265 A1 | 2/2007 | Ishikawa et al. | |
| 2007/0024596 A1 | 2/2007 | Takahashi | |
| 2007/0051609 A1 | 3/2007 | Parkinson | |
| 2007/0068790 A1 | 3/2007 | Yerdon et al. | |
| 2007/0096565 A1 | 5/2007 | Breed et al. | |
| 2007/0103431 A1 | 5/2007 | Tabatowski-Bush | |
| 2007/0115759 A1 | 5/2007 | Sano | |
| 2007/0165005 A1 | 7/2007 | Lii et al. | |
| 2007/0206668 A1 | 9/2007 | Jin | |
| 2007/0226994 A1 | 10/2007 | Wollach et al. | |
| 2007/0232779 A1 | 10/2007 | Moody et al. | |
| 2007/0247429 A1 | 10/2007 | Westerman | |
| 2007/0255468 A1 | 11/2007 | Strebel et al. | |
| 2007/0257891 A1 | 11/2007 | Esenther et al. | |
| 2007/0271072 A1 | 11/2007 | Kovacevich | |
| 2007/0291016 A1 | 12/2007 | Philipp | |
| 2007/0296709 A1 | 12/2007 | GuangHai | |
| 2008/0012835 A1 | 1/2008 | Rimon et al. | |
| 2008/0018604 A1 | 1/2008 | Paun et al. | |
| 2008/0023715 A1 | 1/2008 | Choi | |
| 2008/0030465 A1 | 2/2008 | Konet et al. | |
| 2008/0074398 A1 | 3/2008 | Wright | |
| 2008/0111714 A1 | 5/2008 | Kremin | |
| 2008/0136792 A1 | 6/2008 | Peng et al. | |
| 2008/0142352 A1 | 6/2008 | Wright | |
| 2008/0143681 A1 | 6/2008 | XiaoPing | |
| 2008/0150625 A1* | 6/2008 | Sundstrom | H04L 27/2624 327/551 |
| 2008/0150905 A1 | 6/2008 | Grivna et al. | |
| 2008/0158146 A1 | 7/2008 | Westerman | |
| 2008/0196945 A1 | 8/2008 | Konstas | |
| 2008/0202912 A1 | 8/2008 | Boddie et al. | |
| 2008/0211519 A1 | 9/2008 | Kurumado et al. | |
| 2008/0231290 A1 | 9/2008 | Zhitomirsky | |
| 2008/0238650 A1 | 10/2008 | Riihimaki et al. | |
| 2008/0246723 A1 | 10/2008 | Baumbach | |
| 2008/0257706 A1 | 10/2008 | Haag | |
| 2008/0272623 A1 | 11/2008 | Kadzban et al. | |
| 2009/0009482 A1 | 1/2009 | McDermid | |
| 2009/0046110 A1 | 2/2009 | Sadler et al. | |
| 2009/0066659 A1 | 3/2009 | He et al. | |
| 2009/0079699 A1 | 3/2009 | Sun | |
| 2009/0108985 A1 | 4/2009 | Haag et al. | |
| 2009/0115731 A1 | 5/2009 | Rak | |
| 2009/0120697 A1 | 5/2009 | Wilner et al. | |
| 2009/0135157 A1 | 5/2009 | Harley | |
| 2009/0212849 A1 | 8/2009 | Reime | |
| 2009/0225043 A1 | 9/2009 | Rosener | |
| 2009/0235588 A1 | 9/2009 | Patterson et al. | |
| 2009/0236210 A1 | 9/2009 | Clark et al. | |
| 2009/0251435 A1 | 10/2009 | Westerman et al. | |
| 2009/0256578 A1 | 10/2009 | Wuerstlein et al. | |
| 2009/0256677 A1 | 10/2009 | Hein et al. | |
| 2009/0273563 A1 | 11/2009 | Pryor | |
| 2009/0273573 A1 | 11/2009 | Hotelling | |
| 2009/0295409 A1 | 12/2009 | Irkliy | |
| 2009/0295556 A1 | 12/2009 | Inoue et al. | |
| 2009/0309616 A1 | 12/2009 | Klinghult et al. | |
| 2010/0001746 A1 | 1/2010 | Duchene et al. | |
| 2010/0001974 A1 | 1/2010 | Su et al. | |
| 2010/0007613 A1 | 1/2010 | Costa | |
| 2010/0007620 A1 | 1/2010 | Hsieh et al. | |
| 2010/0013777 A1 | 1/2010 | Baudisch et al. | |
| 2010/0026654 A1 | 2/2010 | Suddreth | |
| 2010/0039392 A1 | 2/2010 | Pratt et al. | |
| 2010/0066391 A1 | 3/2010 | Hirasaka et al. | |
| 2010/0090712 A1 | 4/2010 | Vandermeijden | |
| 2010/0090966 A1 | 4/2010 | Gregorio | |
| 2010/0102830 A1 | 4/2010 | Curtis et al. | |
| 2010/0103139 A1 | 4/2010 | Soo et al. | |
| 2010/0110037 A1 | 5/2010 | Huang et al. | |
| 2010/0117970 A1 | 5/2010 | Burstrom et al. | |
| 2010/0125393 A1 | 5/2010 | Jarvinen et al. | |
| 2010/0156814 A1 | 6/2010 | Weber et al. | |
| 2010/0177057 A1 | 7/2010 | Flint et al. | |
| 2010/0188356 A1 | 7/2010 | Vu et al. | |
| 2010/0188364 A1 | 7/2010 | Lin et al. | |
| 2010/0194692 A1 | 8/2010 | Orr et al. | |
| 2010/0207907 A1 | 8/2010 | Tanabe et al. | |

(56) References Cited

U.S. PATENT DOCUMENTS

| | | |
|---|---|---|
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1* | 9/2010 | Pala ................ B60K 35/00 701/48 |
| 2010/0252048 A1 | 10/2010 | Young et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1* | 11/2010 | Fisher ................ G06F 3/044 345/173 |
| 2010/0296303 A1 | 11/2010 | Sarioglu et al. |
| 2010/0302200 A1 | 12/2010 | Netherton et al. |
| 2010/0309160 A1 | 12/2010 | Lin |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012378 A1 | 1/2011 | Ueno et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0074684 A1 | 3/2011 | Abraham et al. |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0084707 A1* | 4/2011 | Nakayama ......... G01C 21/3664 324/649 |
| 2011/0095997 A1 | 4/2011 | Philipp |
| 2011/0096025 A1 | 4/2011 | Slobodin et al. |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0139934 A1 | 6/2011 | Giesa et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0181387 A1 | 7/2011 | Popelard |
| 2011/0187492 A1 | 8/2011 | Newman et al. |
| 2011/0210755 A1 | 9/2011 | Ogawa |
| 2011/0227872 A1 | 9/2011 | Huska et al. |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1 | 2/2012 | Sitarski |
| 2012/0043973 A1 | 2/2012 | Kremin |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0075246 A1* | 3/2012 | Chang ................ G06F 3/0416 345/174 |
| 2012/0104790 A1 | 5/2012 | Plavetich et al. |
| 2012/0126941 A1 | 5/2012 | Coggill |
| 2012/0154324 A1 | 6/2012 | Wright et al. |
| 2012/0160657 A1 | 6/2012 | Mizushima |
| 2012/0161795 A1 | 6/2012 | Pfau et al. |
| 2012/0217147 A1 | 8/2012 | Porter et al. |
| 2012/0293447 A1 | 11/2012 | Heng et al. |
| 2012/0312676 A1 | 12/2012 | Salter et al. |
| 2012/0313648 A1 | 12/2012 | Salter et al. |
| 2012/0313767 A1 | 12/2012 | Sitarski |
| 2012/0319992 A1 | 12/2012 | Lee |
| 2013/0002419 A1 | 1/2013 | Lee |
| 2013/0024169 A1* | 1/2013 | Veerasamy ....... B32B 17/10036 703/2 |
| 2013/0033356 A1* | 2/2013 | Sitarski ................ G06F 13/42 340/1.1 |
| 2013/0036529 A1 | 2/2013 | Salter et al. |
| 2013/0076121 A1 | 3/2013 | Salter et al. |
| 2013/0076375 A1 | 3/2013 | Hanumanthaiah et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0147709 A1* | 6/2013 | Kim ................ G06F 1/1694 345/158 |
| 2013/0162596 A1 | 6/2013 | Kono et al. |
| 2013/0170013 A1 | 7/2013 | Tonar et al. |
| 2013/0241578 A1 | 9/2013 | Satake et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0069015 A1 | 3/2014 | Salter et al. |
| 2014/0252879 A1 | 9/2014 | Dassanayake et al. |
| 2014/0293158 A1 | 10/2014 | Kurasawa et al. |
| 2014/0300403 A1* | 10/2014 | Okamoto ............ H03F 3/45076 327/333 |
| 2014/0306723 A1 | 10/2014 | Salter et al. |
| 2014/0306724 A1 | 10/2014 | Dassanayake et al. |
| 2015/0042603 A1 | 2/2015 | Takano et al. |
| 2015/0077227 A1 | 3/2015 | Salter et al. |
| 2015/0177876 A1 | 6/2015 | Ishii et al. |
| 2015/0180471 A1 | 6/2015 | Buttolo et al. |
| 2015/0229305 A1 | 8/2015 | Buttolo et al. |
| 2015/0234493 A1 | 8/2015 | Parivar et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| GB | 2071338 | 9/1981 |

(56) References Cited

FOREIGN PATENT DOCUMENTS

| | | |
|---|---|---|
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| KR | 101258376 | 4/2013 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012169106 | 12/2012 |

OTHER PUBLICATIONS

U.S. Appl. No. 14/552,809, filed Nov. 25, 2014, entitled "Proximity Switch Based Door Latch Release," (14 pages of specification and 4 pages of drawings) and Official Filing Receipt (3 pages).
U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).
U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).
U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).
U.S. Appl. No. 14/717,031, filed May 20, 2015, entitled "Proximity Sensor Assembly Having Interleaved Electrode Configuration," (38 pages of specification and 21 pages of drawings) and Official Filing Receipt (3 pages).
U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).
U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).
"Clevios P Formulation Guide," 12 pages, www.clevios.com, Heraeus Clevios GmbH, no date provided.
"Introduction to Touch Solutions, White Paper, Revision 1.0 A," Densitron Corporation, 14 pages, Aug. 21, 2007.
Kliffken, Marksu G. et al., "Obstacle Detection for Power Operated Window-Lift and Sunroof Actuation Systems," Paper No. 2001-01-0466, 1 page, ©2011 SAE International, Published Mar. 5, 2001.
NXP Capacitive Sensors, 1 page, www.nxp.com, copyrighted 2006-2010, NXP Semiconductors.
"Moisture Immunity in QuickSense Studio," AN552, Rev. 0.1 10/10, 8 pages, Silicon Laboratories, Inc., © 2010.
"Orgacon EL-P3000, Screen printing Ink Series 3000," 2 pages, AGFA, last updated in Feb. 2006.
"Charge-Transfer Sensing-Based Touch Controls Facilitate Creative Interfaces," www.ferret.com.au, 2 pages, Jan. 18, 2006.
Kiosk Peripherals, "Touch Screen," www.bitsbytesintegrators.com/kiosk-peripherals.html, 10 pages, no date provided.
JVC KD-AVX777 Detachable Front-Panel with Integrated 5.4" Touch-Screen Monitor, 6 pages, www.crutchfield.com, no date provided.
Ergonomic Palm Buttons, Pepperl+Fuchs, www.wolfautomation.com, 6 pages, no date provided.
"Touch Sensors Design Guide" by ATMEL, 10620 D-AT42-04/09, Revised Apr. 2009, 72 pages, Copyrighted 2008-2009 Atmel Corporation.
"Capacitive Touch Switches for Automotive Applications," by Dave Van Ess of Cypress Semiconductor Corp., published in Automotive DesignLine (http://www.automotivedesignline.com), Feb. 2006, 7 pages.
U.S. Appl. No. 13/665,253, filed Oct. 31, 2012, entitled "Proximity Switch Based Door Latch Release," (14 pages of specification and 4 pages of drawings) and Official Filing Receipt (3 pages).
U.S. Appl. No. 13/799,413, filed Mar. 13, 2013, entitled "Proximity Interface Development System Having Replicator and Method," (29 pages of specification and 20 pages of drawings ) and Official Filing Receipt (3 pages).
U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).
U.S. Appl. No. 14/227,134, filed Mar. 27, 2014, entitled "Proximity Switch Assembly and Method of Tuning Same" (39 pages of specification and 20 pages of drawings) and Official Filing Receipt (3 pages).

* cited by examiner

PROXIMITY SWITCH ASSEMBLY AND ACTIVATION METHOD HAVING VIRTUAL BUTTON MODE

CROSS-REFERENCE TO RELATED APPLICATION

This application is a continuation-in-part of U.S. patent application Ser. No. 13/444,393, filed on Apr. 11, 2012, entitled "PROXIMITY SWITCH ASSEMBLY AND ACTIVATION METHOD WITH EXPLORATION MODE" now issued as U.S. Pat. No. 8,933,708. The aforementioned related application is hereby incorporated by reference.

FIELD OF THE INVENTION

The present invention generally relates to switches, and more particularly relates to proximity switches having an enhanced determination of switch activation.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and generally require that a user select a single desired capacitive switch to perform the intended operation. In some applications, such as use in an automobile, the driver of the vehicle has limited ability to view the switches due to driver distraction. In such applications, it is desirable to allow the user to explore the switch assembly for a specific button while avoiding a premature determination of switch activation. Thus, it is desirable to discriminate whether the user intends to activate a switch, or is simply exploring for a specific switch button while focusing on a higher priority task, such as driving, or has no intent to activate a switch. Accordingly, it is desirable to provide for a proximity switch arrangement which enhances the use of proximity switches by a person, such as a driver of a vehicle.

SUMMARY OF THE INVENTION

According to one aspect of the present invention, a method of activating a proximity switch is provided. The method includes the steps of generating an activation field associated with each of a proximity sensor, and monitoring a signal indicative of each associated activation field. The method also includes the steps of determining a first amplitude when the signal is stable for a minimum time period, and determining a subsequent second amplitude when the signal is stable for the minimum time period. The method further includes the step of generating an activation output when the second amplitude exceeds the first amplitude by a known amount.

According to another aspect of the present invention, a method of activating a proximity switch is provided. The method includes the steps of generating a plurality of activation fields with a plurality of proximity sensors, and monitoring signals indicative of the activation fields. The method also includes the steps of detecting sliding of a user's finger based on multiple signals and entering an exploration mode, determining a first stable amplitude of one of the signals for a time period, and determining a second stable amplitude of the one of the signals for the time period. The method further includes the step of generating an activation field when the second stable amplitude exceeds the first stable amplitude by a known amount.

According to a further aspect of the present invention, a proximity switch assembly is provided. The proximity switch assembly includes a plurality of proximity switches each providing a sense activation field. The proximity switch assembly further includes control circuitry that monitors signals indicative of the activation fields, determines a first stable amplitude of the signal for a time period, determines a subsequent second stable amplitude of the signal for the time period, and generates an activation output when the second stable signal exceeds the first stable signal by a known amount.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
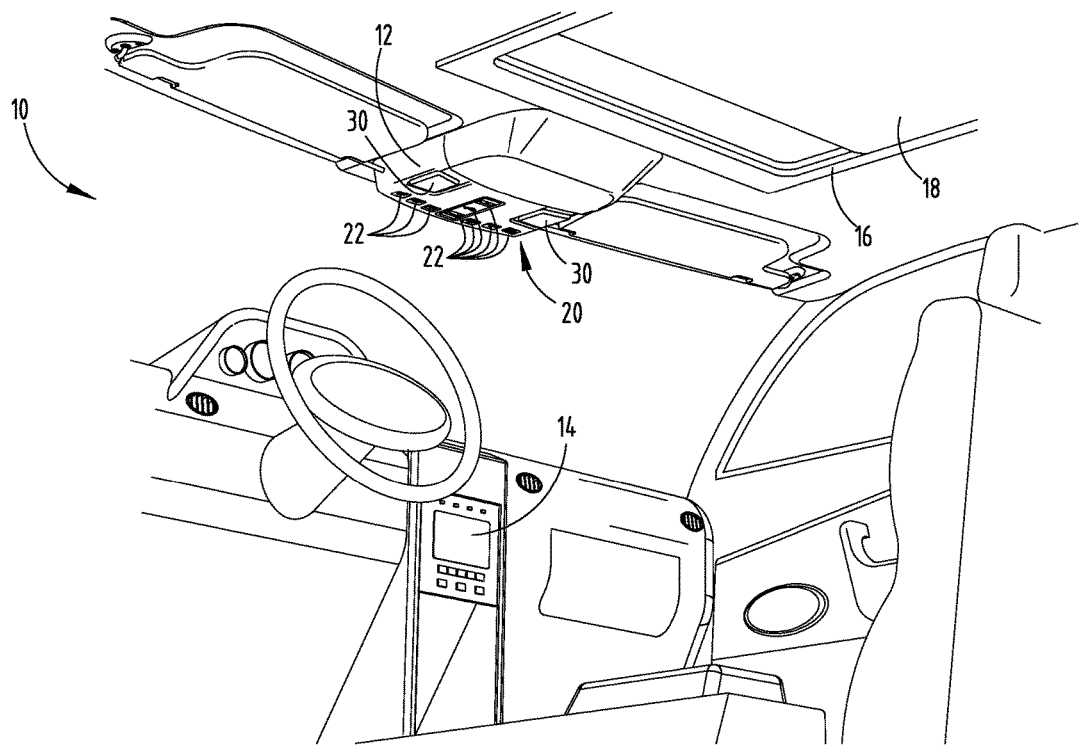
FIG. 1 is a perspective view of a passenger compartment of an automotive vehicle having an overhead console employing a proximity switch assembly, according to one embodiment.
Figure 2:
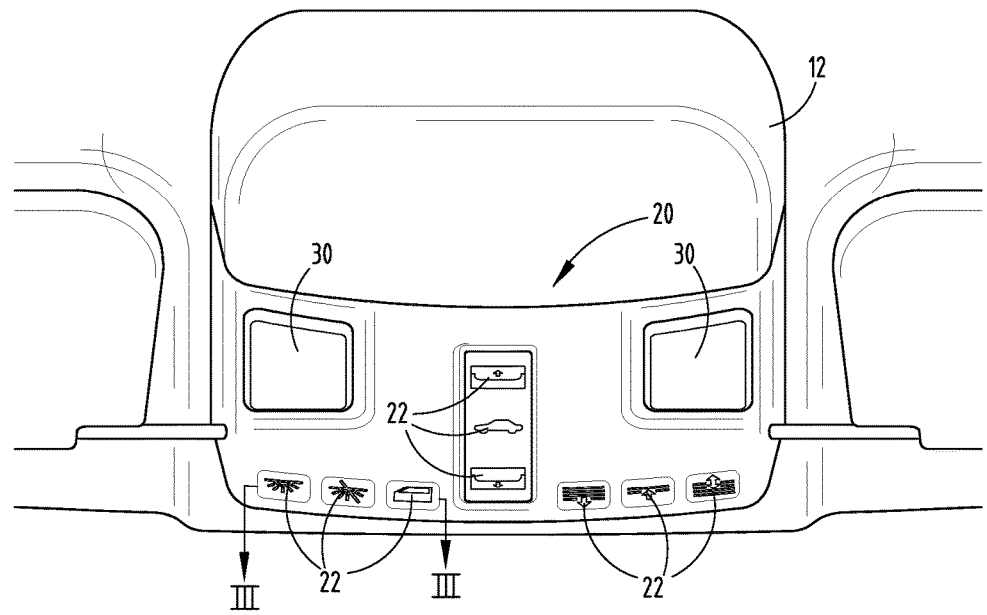
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
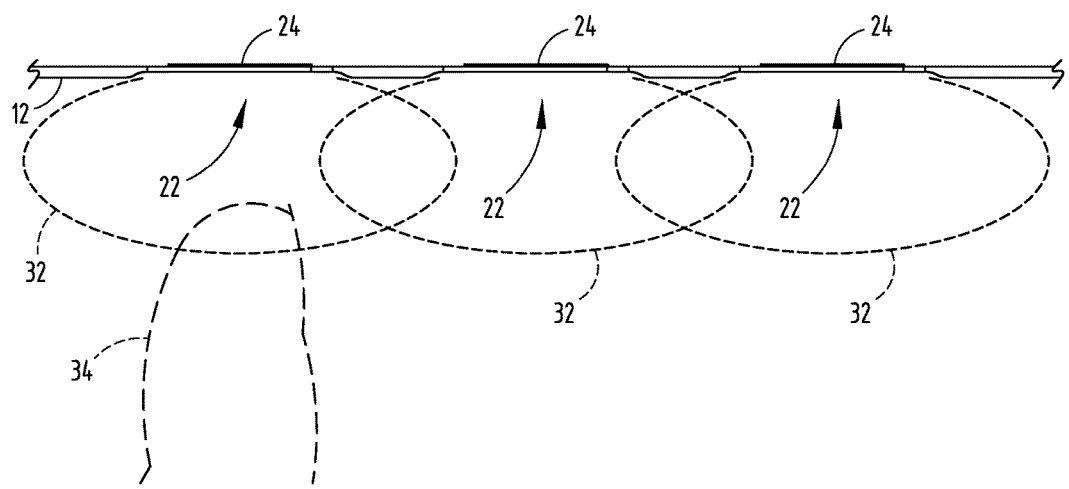
FIG. 3 is an enlarged cross-sectional view taken through line III-III in FIG. 2 showing an array of proximity switches in relation to a user's finger.
Figure 4:
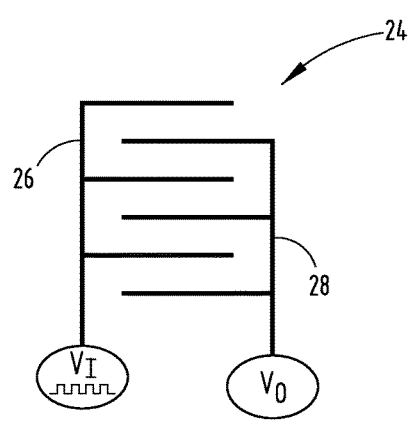
FIG. 4 is a schematic diagram of a capacitive sensor employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 during use of the switch assembly 20. Each proximity switch 22 includes one or more proximity sensors 24 for generating a sense activation field. According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serve as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 5:
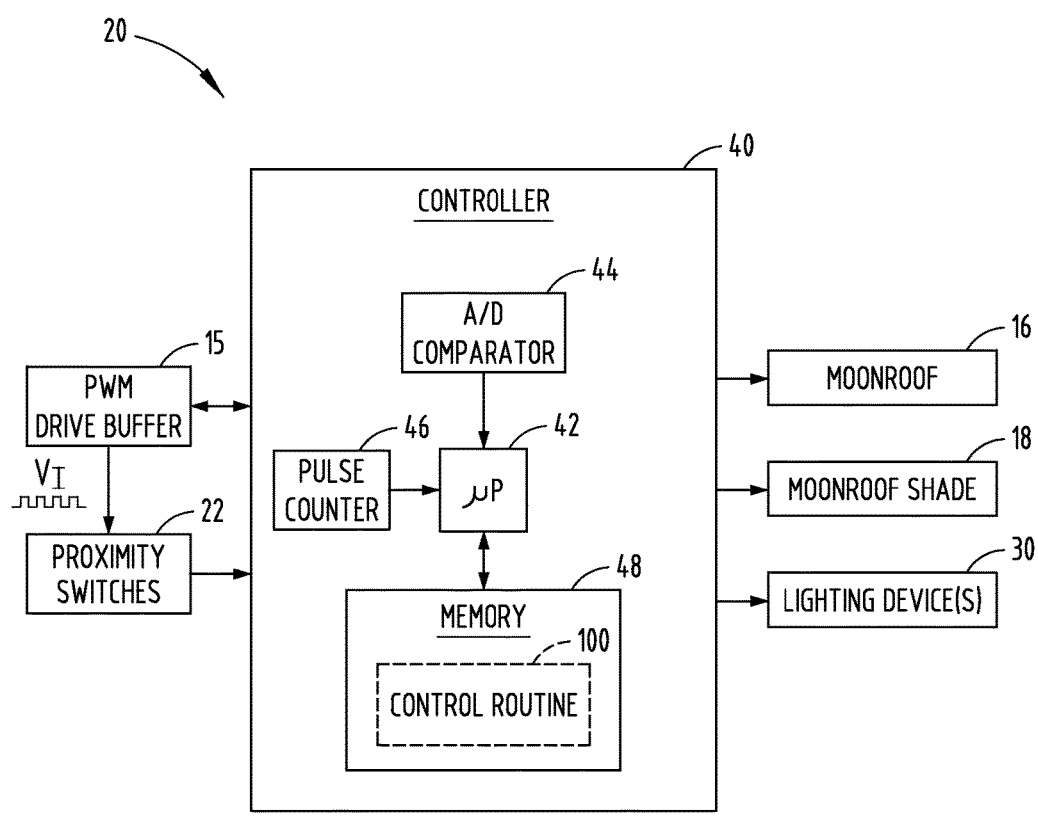
FIG. 5 is a block diagram illustrating the proximity switch assembly, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field signal to one or more thresholds pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to correct activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes a control routine 100 stored in memory to monitor and make a determination as to activation of one of the proximity switches.

In FIGS. 6-13, the change in sensor charge pulse counts shown as Δ Sensor Count for a plurality of signal channels associated with a plurality of proximity switches 22, such as the three switches 22 shown in FIG. 3, is illustrated according to various examples. The change in sensor charge pulse count is the difference between an initialized referenced count value without any finger or other object present in the activation field and the corresponding sensor reading. In these examples, the user's finger enters the activation fields 32 associated with each of three proximity switches 22, generally one sense activation field at a time with overlap between adjacent activation fields 32 as the user's finger moves across the array of switches. Channel 1 is the change (Δ) in sensor charge pulse count associated with a first capacitive sensor 24, channel 2 is the change in sensor charge pulse count associated with the adjacent second capacitive sensor 24, and channel 3 is the change in sensor charge pulse count associated with the third capacitive sensor 24 adjacent to the second capacitive sensor. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the user's hand motion when the hand, particularly a finger, is in close proximity to the proximity switches 22, to discriminate whether the intent of the user is to activate a switch 22, explore for a specific switch button while focusing on higher priority tasks, such as driving, or is the result of a task such as adjusting the rearview mirror that has nothing to do with actuation of a proximity switch 22. The proximity switch assembly 20 may operate in an exploration or hunting mode which enables the user to explore the keypads or buttons by passing or sliding a finger in close proximity to the switches without triggering an activation of a switch until the user's intent is determined. The proximity switch assembly 20 monitors amplitude of a signal generated in response to the activation field, determines a differential change in the generated signal, and generates an activation output when the differential signal exceeds a threshold. As a result, exploration of the proximity switch assembly 20 is allowed, such that users are free to explore the switch interface pad with their fingers without inadvertently triggering an event, the interface response time is fast, activation happens when the finger contacts a surface panel, and inadvertent activation of the switch is prevented or reduced.

Figure 6:
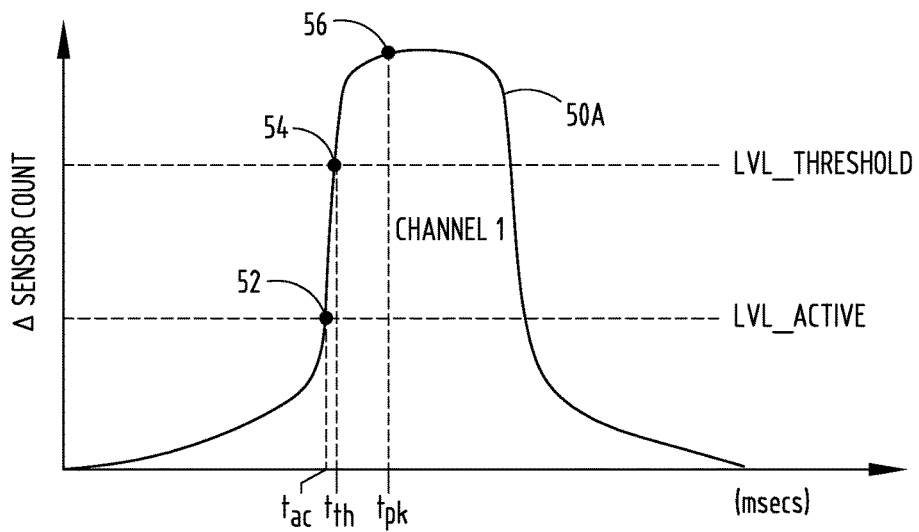
FIG. 6 is a graph illustrating the signal count for one channel associated with a capacitive sensor showing an activation motion profile.

Referring to FIG. 6, as the user's finger 34 approaches a switch 22 associated with signal channel 1, the finger 34 enters the activation field 32 associated with the sensor 24 which causes disruption to the capacitance, thereby resulting in a sensor count increase as shown by signal 50A having a typical activation motion profile. An entry ramp slope method may be used to determine whether the operator intends to press a button or explore the interface based on the slope of the entry ramp in signal 50A of the channel 1 signal rising from point 52 where signal 50A crosses the level active (LVL_ACTIVE) count up to point 54 where signal 50A crosses the level threshold (LVL_THRESHOLD) count, according to one embodiment. The slope of the entry ramp is the differential change in the generated signal between points 52 and 54 which occurred during the time period between times $t_{th}$ and $t_{ac}$. Because the numerator level threshold—level active generally changes only as the presence of gloves is detected, but is otherwise a constant, the slope can be calculated as just the time expired to cross from level active to level threshold referred to as $t_{active2threshold}$ which is the difference between time $t_{th}$ and $t_{ac}$. A direct push on a switch pad typically may occur in a time period referred to $t_{directpush}$ in the range of about 40 to 60 milliseconds. If the time $t_{active2threshold}$ is less than or equal to the direct push time $t_{directpush}$, then activation of the switch is determined to occur. Otherwise, the switch is determined to be in an exploration mode.

According to another embodiment, the slope of the entry ramp may be computed as the difference in time from the time $t_{ac}$ at point 52 to time $t_{pk}$ to reach the peak count value at point 56, referred to as time $t_{active2peak}$. The time $t_{active2peak}$ may be compared to a direct push peak, referred to as $t_{direct\_push\_pk}$ which may have a value of 100 milliseconds according to one embodiment. If time $t_{active2peak}$ is less than or equal to the $t_{direct\_push\_pk}$ activation of the switch is determined to occur. Otherwise, the switch assembly operates in an exploration mode.

In the example shown in FIG. 6, the channel 1 signal is shown increasing as the capacitance disturbance increases rising quickly from point 52 to peak value at point 56. The proximity switch assembly 20 determines the slope of the entry ramp as either time period $t_{active2threshold}$ or $t_{active2peak}$ for the signal to increase from the first threshold point 52 to either the second threshold at point 54 or the peak threshold at point 56. The slope or differential change in the generated signal is then used for comparison with a representative direct push threshold $t_{direct\_push}$ or $t_{direct\_push\_pk}$ to determine activation of the proximity switch. Specifically, when time $t_{active2peak}$ is less than the $t_{direct\_push}$ or $t_{active2threshold}$ is less than $t_{direct\_push}$, activation of the switch is determined. Otherwise, the switch assembly remains in the exploration mode.

Figure 7:
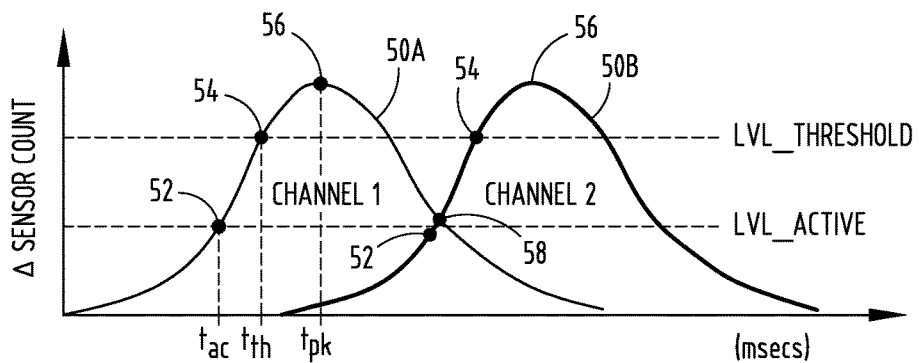
FIG. 7 is a graph illustrating the signal count for two channels associated with the capacitive sensors showing a sliding exploration/hunting motion profile.

Referring to FIG. 7, one example of a sliding/exploration motion across two switches is illustrated as the finger passes or slides through the activation field of two adjacent proximity sensors shown as signal channel 1 labeled 50A and signal channel 2 labeled 50B. As the user's finger approaches a first switch, the finger enters the activation field associated with the first switch sensor causing the change in sensor count on signal 50A to increase at a slower rate such that a lessened differential change in the generated signal is determined. In this example, the profile of signal channel 1 experiences a change in time $t_{active2peak}$ that is not less than or equal to $t_{direct\_push}$, thereby resulting in entering the hunting or exploration mode. Because the $t_{active2threshold}$ is indicative of a slow differential change in the generated signal, no activation of the switch button is initiated, according to one embodiment. According to another embodiment, because the time $t_{active2peak}$ is not less than or equal to $t_{direct\_push\_pk}$, indicative of a slow differential change in a generated signal, no activation is initiated, according to another embodiment. The second signal channel labeled 50B is shown as becoming the maximum signal at transition point 58 and has a rising change in $\Delta$ sensor count with a differential change in the signal similar to that of signal 50A. As a result, the first and second channels 50A and 50B reflect a sliding motion of the finger across two capacitive sensors in the exploration mode resulting in no activation of either switch. Using the time period $t_{active2threshold}$ or $t_{active2peak}$, a decision can be made to activate or not a proximity switch as its capacitance level reaches the signal peak.

Figure 8:
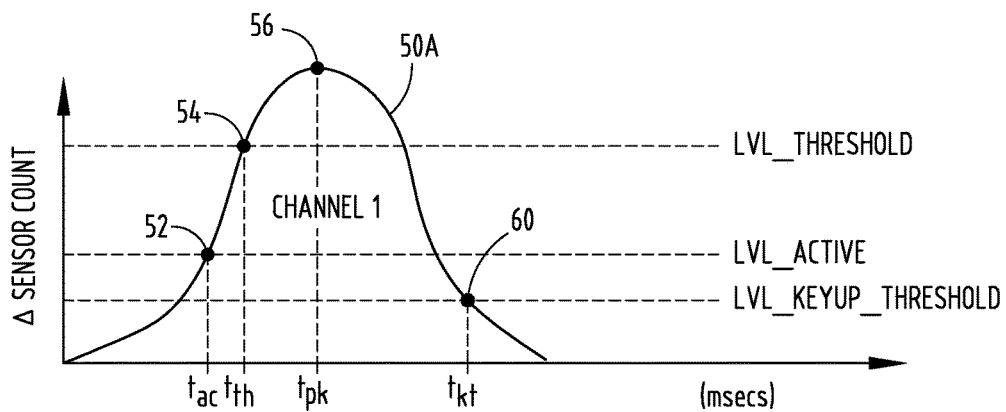
FIG. 8 is a graph illustrating the signal count for a signal channel associated with the capacitive sensors showing a slow activation motion profile.

For a slow direct push motion such as shown in FIG. 8, additional processing may be employed to make sure that no activation is intended. As seen in FIG. 8, the signal channel 1 identified as signal 50A is shown more slowly rising during either time period $t_{active2threshold}$ or $t_{active2peak}$ which would result in the entering of the exploration mode. When such a sliding/exploration condition is detected, with the time $t_{active2threshold}$ greater than $t_{direct\_push}$ if the channel failing the condition was the first signal channel entering the exploration mode and it is still the maximum channel (channel with the highest intensity) as its capacitance drops below LVL_KEYUP_Threshold at point 60, then activation of the switch is initiated.

Figure 9:
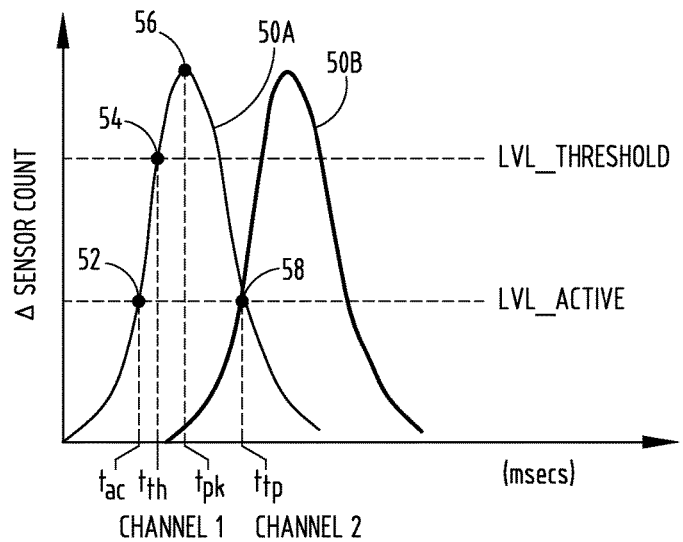
FIG. 9 is a graph illustrating the signal count for two channels associated with the capacitive sensors showing a fast sliding exploration/hunting motion profile.

Referring to FIG. 9, a fast motion of a user's finger across the proximity switch assembly is illustrated with no activation of the switches. In this example, the relatively large differential change in the generated signal for channels 1 and 2 are detected, for both channels 1 and 2 shown by lines 50A and 50B, respectively. The switch assembly employs a delayed time period to delay activation of a decision until the transition point 58 at which the second signal channel 50B rises above the first signal channel 50A. The time delay could be set equal to time threshold $t_{direct\_push\_pk}$ according to one embodiment. Thus, by employing a delay time period before determining activation of a switch, the very fast exploration of the proximity keypads prevents an unintended activation of a switch. The introduction of the time delay in the response may make the interface less responsive and may work better when the operator's finger motion is substantially uniform.

If a previous threshold event that did not result in activation was recently detected, the exploration mode may be entered automatically, according to one embodiment. As a result, once an inadvertent actuation is detected and rejected, more caution may be applied for a period of time in the exploration mode.

Another way to allow an operator to enter the exploration mode is to use one or more properly marked and/or textured areas or pads on the switch panel surface associated with the dedicated proximity switches with the function of signaling the proximity switch assembly of the intent of the operator to blindly explore. The one or more exploration engagement pads may be located in an easy to reach location not likely to generate activity with other signal channels. According to another embodiment, an unmarked, larger exploration engagement pad may be employed surrounding the entire switch interface. Such an exploration pad would likely be encountered first as the operator's hand slides across the trim in the overhead console looking for a landmark from which to start blind exploration of the proximity switch assembly.

Once the proximity sensor assembly determines whether an increase in the change in sensor count is a switch activation or the result of an exploration motion, the assembly proceeds to determine whether and how the exploration motion should terminate or not in an activation of proximity switch. According to one embodiment, the proximity switch assembly looks for a stable press on a switch button for at least a predetermined amount of time. In one specific embodiment, the predetermined amount of time is equal to or greater than 50 milliseconds, and more preferably about 80 milliseconds. Examples of the switch assembly operation employing a stable time methodology is illustrated in FIGS. 10-13.

Figure 10:
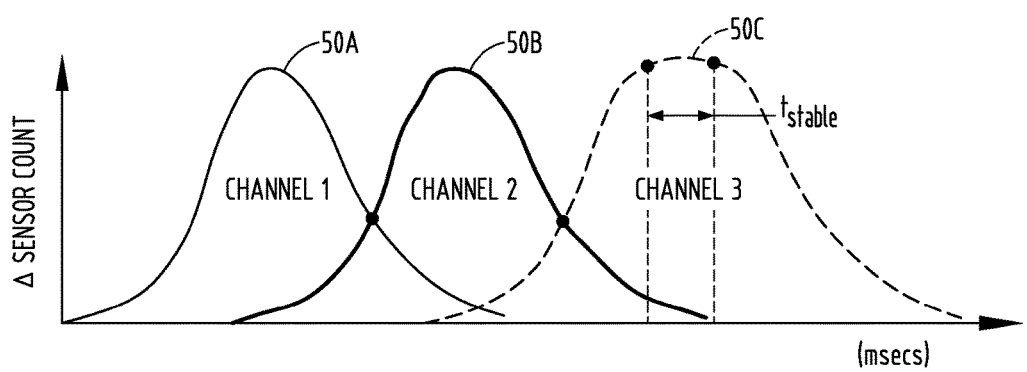
FIG. 10 is a graph illustrating the signal count for three channels associated with the capacitive sensors in an exploration/hunting mode illustrating a stable press activation at the peak, according to one embodiment.

Referring to FIG. 10, the exploration of three proximity switches corresponding to signal channels 1-3 labeled as signals 50A-50C, respectively, is illustrated while a finger slides across first and second switches in the exploration mode and then activates the third switch associated with signal channel 3. As the finger explores the first and second switches associated with channels 1 and 2, no activation is determined due to no stable signal on lines 50A and 50B. The signal on line 50A for channel 1 begins as the maximum signal value until channel 2 on line 50B becomes the maximum value and finally channel 3 becomes a maximum value. Signal channel 3 is shown having a stable change in sensor count near the peak value for a sufficient time period $t_{stable}$ such as 80 milliseconds which is sufficient to initiate activation of the corresponding proximity switch. When the level threshold trigger condition has been met and a peak has been reached, the stable level method activates the switch after the level on the switch is bound in a tight range for at least the time period $t_{stable}$. This allows the operator to explore the various proximity switches and to activate a desired switch once it is found by maintaining position of the user's finger in proximity to the switch for a stable period of time $t_{stable}$.

Figure 11:
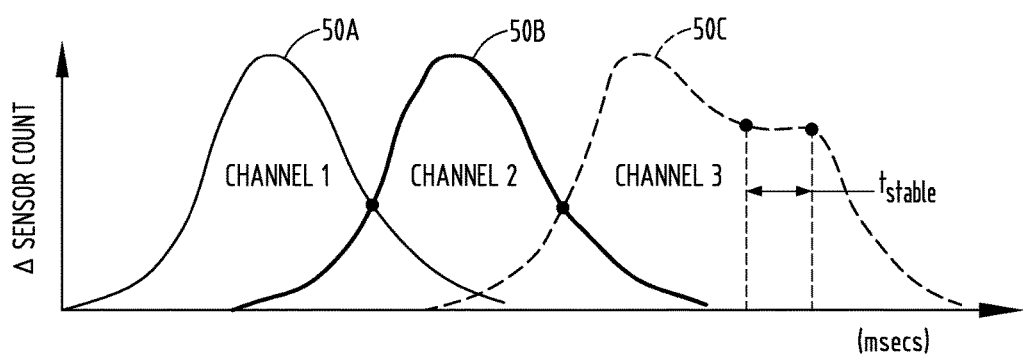
FIG. 11 is a graph illustrating the signal count for three channels associated with the capacitive sensors in an exploration/hunting mode illustrating stable press activation on signal descent below the peak, according to another embodiment.

Referring to FIG. 11, another embodiment of the stable level method is illustrated in which the third signal channel on line 50C has a change in sensor count that has a stable condition on the descent of the signal. In this example, the change in sensor count for the third channel exceeds the level threshold and has a stable press detected for the time period $t_{stable}$ such that activation of the third switch is determined.

Figure 12:
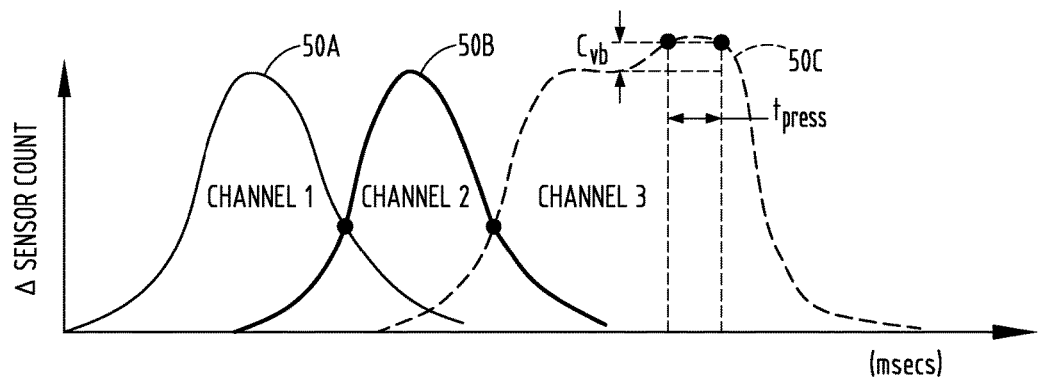
FIG. 12 is a graph illustrating the signal count for three channels associated with the capacitive sensors in an exploration/hunting mode illustrating increased stable pressure on a pad to activate a switch, according to a further embodiment.
Figure 13:
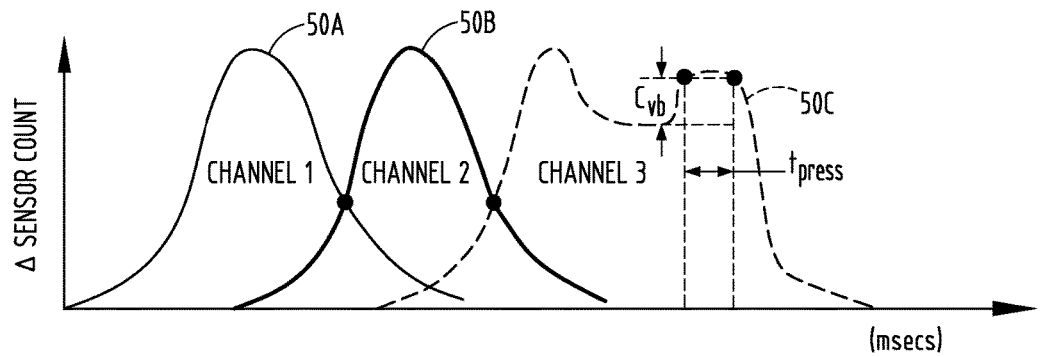
FIG. 13 is a graph illustrating the signal count for three channels associated with the capacitive sensors in an exploration mode and selection of a pad based on increased stable pressure, according to a further embodiment.

According to another embodiment, the proximity switch assembly may employ a virtual button method which looks for an initial peak value of change in sensor count while in the exploration mode followed by an additional sustained increase in the change in sensor count to make a determination to activate the switch as shown in FIGS. 12 and 13. In FIG. 12, the third signal channel on line 50C rises up to an initial peak value and then further increases by a change in sensor count $C_{vb}$. This is equivalent to a user's finger gently brushing the surface of the switch assembly as it slides across the switch assembly, reaching the desired button, and then pressing down on the virtual mechanical switch such that the user's finger presses on the switch contact surface and increases the amount of volume of the finger closer to the switch. The increase in capacitance is caused by the increased surface of the fingertip as it is compressed on the pad surface. The increased capacitance may occur immediately following detection of a peak value shown in FIG. 12 or may occur following a decline in the change in sensor count as shown in FIG. 13. The proximity switch assembly detects an initial peak value followed by a further increased change in sensor count indicated by capacitance $C_{vb}$ at a stable level or a stable time period $t_{stable}$. A stable level of detection generally means no change in sensor count value absent noise or a small change in sensor count value absent noise which can be predetermined during calibration.

It should be appreciated that a shorter time period $t_{stable}$ may result in accidental activations, especially following a reversal in the direction of the finger motion and that a longer time period $t_{stable}$ may result in a less responsive interface.

It should also be appreciated that both the stable value method and the virtual button method can be active at the same time. In doing so, the stable time $t_{stable}$ can be relaxed to be longer, such as one second, since the operator can always trigger the button using the virtual button method without waiting for the stable press time-out.

The proximity switch assembly may further employ robust noise rejection to prevent annoying inadvertent actuations. For example, with an overhead console, accidental opening and closing of the moonroof should be avoided. Too much noise rejection may end up rejecting intended activations, which should be avoided. One approach to rejecting noise is to look at whether multiple adjacent channels are reporting simultaneous triggering events and, if so, selecting the signal channel with the highest signal and activating it, thereby ignoring all other signal channels until the release of the select signal channel.

The proximity switch assembly 20 may include a signature noise rejection method based on two parameters, namely a signature parameter that is the ratio between the channel between the highest intensity (max_channel) and the overall cumulative level (sum_channel), and the dac parameter which is the number of channels that are at least a certain ratio of the max_channel. In one embodiment, the dac $\alpha_{dac}$=0.5. The signature parameter may be defined by the following equation:

$$\text{signature} = \frac{\text{max\_channel}}{\text{sum\_channel}} = \frac{\max_{i=0,n} \text{channel}_i}{\sum_{i=0,n} \text{channel}_i}.$$

The dac parameter may be defined by the following equation:

$$dac = \forall channels_i > \alpha_{dac} \text{max\_channel}.$$

Depending on dac, for a recognized activation not to be rejected, the channel generally must be clean, i.e., the signature must be higher than a predefined threshold. In one embodiment, $\alpha_{dac=1}$=0.4, and $\alpha_{dac=2}$=0.67. If the dac is greater than 2, the activation is rejected according to one embodiment.

When a decision to activate a switch or not is made on the descending phase of the profile, then instead of max_channel and sum_channel their peak values peak_max_channel and peak_sum_channel may be used to calculate the signature. The signature may have the following equation:

$$\text{signature} = \frac{\text{peak\_max\_channel}}{\text{peak\_sum\_channel}} = \frac{\max(\text{max\_channel}(t))}{\max(\text{sum\_channel}(t))}.$$

A noise rejection triggers hunting mode may be employed. When a detected activation is rejected because of a dirty signature, the hunting or exploration mode should be automatically engaged. Thus, when blindly exploring, a user may reach with all fingers extended looking to establish a reference frame from which to start hunting. This may trigger multiple channels at the same time, thereby resulting in a poor signature.

Figure 14:
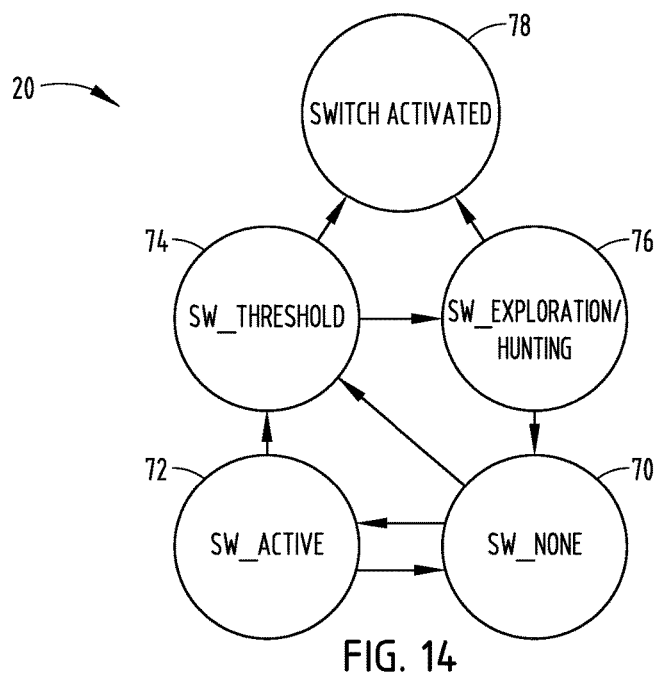
FIG. 14 is a state diagram illustrating five states of the capacitive switch assembly implemented with a state machine, according to one embodiment.

Referring to FIG. 14, a state diagram is shown for the proximity switch assembly 20 in a state machine implementation, according to one embodiment. The state machine implementation is shown having five states including SW_NONE state 70, SW_ACTIVE state 72, SW_THRESHOLD state 74, SW_HUNTING state 76 and SWITCH_ACTIVATED state 78. The SW_NONE state 70 is the state in which there is no sensor activity detected. The SW_ACTIVE state is the state in which some activity is detected by the sensor, but not enough to trigger activation of the switch at that point in time. The SW_THRESHOLD state is the state in which activity as determined by the sensor is high enough to warrant activation, hunting/exploration, or casual motion of the switch assembly. The SW_HUNTING state 76 is entered when the activity pattern as determined by the switch assembly is compatible with the exploration/hunting interaction. The SWITCH_ACTIVATED state 78 is the state in which activation of a switch has been identified. In the SWITCH_ACTIVATED state 78, the switch button will remain active and no other selection will be possible until the corresponding switch is released.

The state of the proximity switch assembly 20 changes depending upon the detection and processing of the sensed signals. When in the SW_NONE state 70, the system 20 may advance to the SW_ACTIVE state 72 when some activity is detected by one or more sensors. If enough activity to warrant either activation, hunting or casual motion is detected, the system 20 may proceed directly to the SW_THRESHOLD state 74. When in the SW_THRESHOLD state 74, the system 20 may proceed to the SW_HUNTING state 76 when a pattern indicative of exploration is detected or may proceed directly to switch activated state 78. When a switch activation is in the SW_HUNTING state, an activation of the switch may be detected to change to the SWITCH_ACTIVATED state 78. If the signal is rejected and inadvertent action is detected, the system 20 may return to the SW_NONE state 70.

Figure 15:
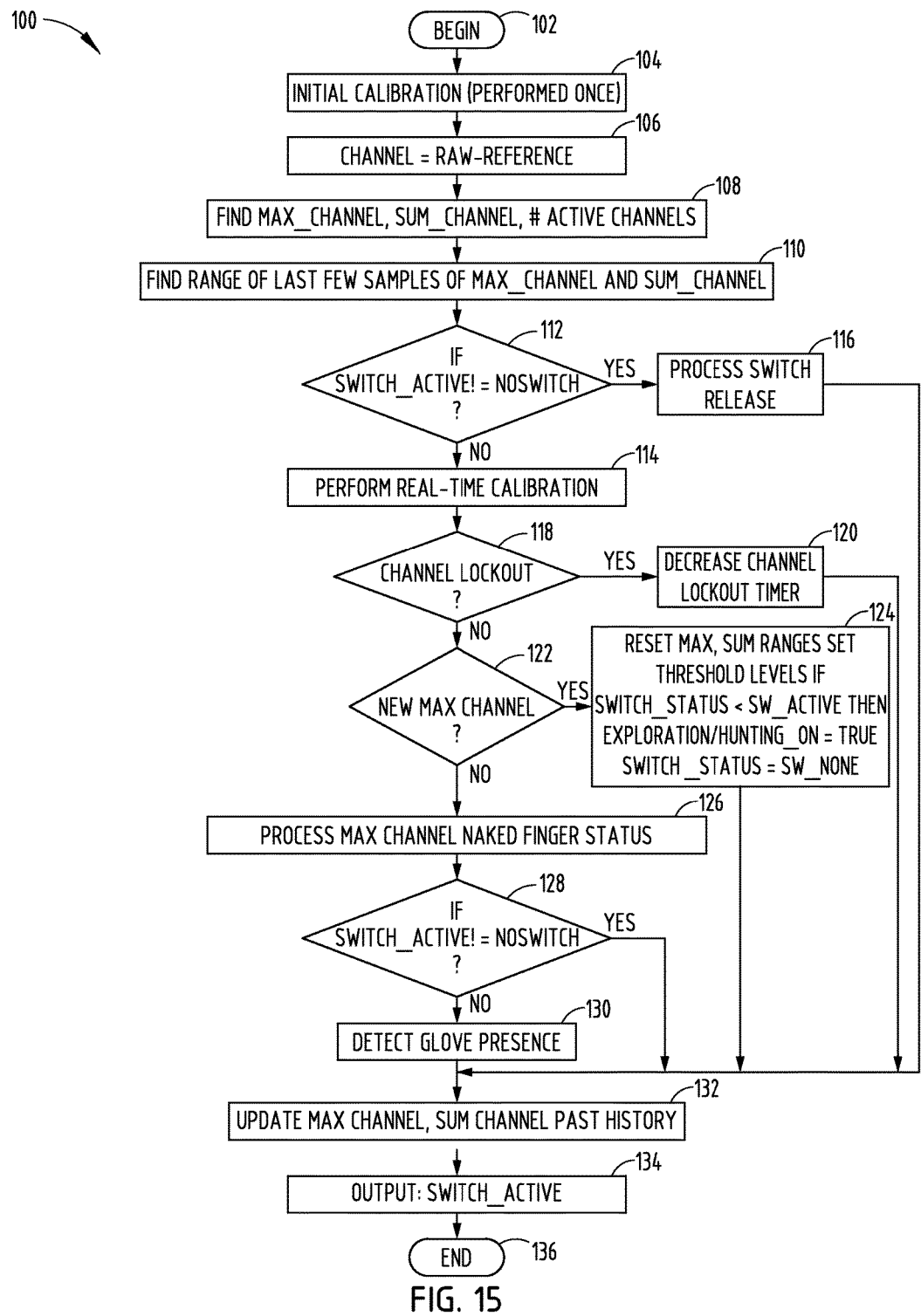
FIG. 15 is a flow diagram illustrating a routine for executing a method of activating a switch of the switch assembly, according to one embodiment.

Referring to FIG. 15, the main method 100 of monitoring and determining when to generate an activation output with the proximity switch arrangement is shown, according to one embodiment. Method 100 begins at step 102 and proceeds to step 104 to perform an initial calibration which may be performed once. The calibrated signal channel values are computed from raw channel data and calibrated reference values by subtracting the reference value from the raw data in step 106. Next, at step 108, from all signal channel sensor readings, the highest count value referenced as max_channel and the sum of all channel sensor readings referred to as sum_channel are calculated. In addition, the number of active channels is determined. At step 110, method 100 calculates the recent range of the max_channel and the sum_channel to determine later whether motion is in progress or not.

Following step 110, method 100 proceeds to decision step 112 to determine if any of the switches are active. If no switch is active, method 100 proceeds to step 114 to perform an online real-time calibration. Otherwise, method 116 processes the switch release at step 116. Accordingly, if a switch was already active, then method 100 proceeds to a module where it waits and locks all activity until its release.

Following the real-time calibration, method 100 proceeds to decision step 118 to determine if there is any channel lockout indicative of recent activation and, if so, proceeds to step 120 to decrease the channel lockout timer. If there are no channel lockouts detected, method 100 proceeds to decision step 122 to look for a new max_channel. If the current max_channel has changed such that there is a new max_channel, method 100 proceeds to step 124 to reset the max_channel, sum the ranges, and set the threshold levels. Thus, if a new max_channel is identified, the method resets the recent signal ranges, and updates, if needed, the hunting/exploration parameters. If the switch_status is less than SW_ACTIVE, then the hunting/exploration flag is set equal to true and the switch_status is set equal to SW_NONE. If the current max_channel has not changed, method 100 proceeds to step 126 to process the max_channel naked (no glove) finger status. This may include processing the logic between the various states as shown in the state diagram of FIG. 14.

Following step 126, method 100 proceeds to decision step 128 to determine if any switch is active. If no switch activation is detected, method 100 proceeds to step 130 to detect a possible glove presence on the user's hand. The presence of a glove may be detected based on a reduced change in capacitance count value. Method 100 then proceeds to step 132 to update the past history of the max_channel and sum_channel. The index of the active switch, if any, is then output to the software hardware module at step 134 before ending at step 136.

Figure 16:
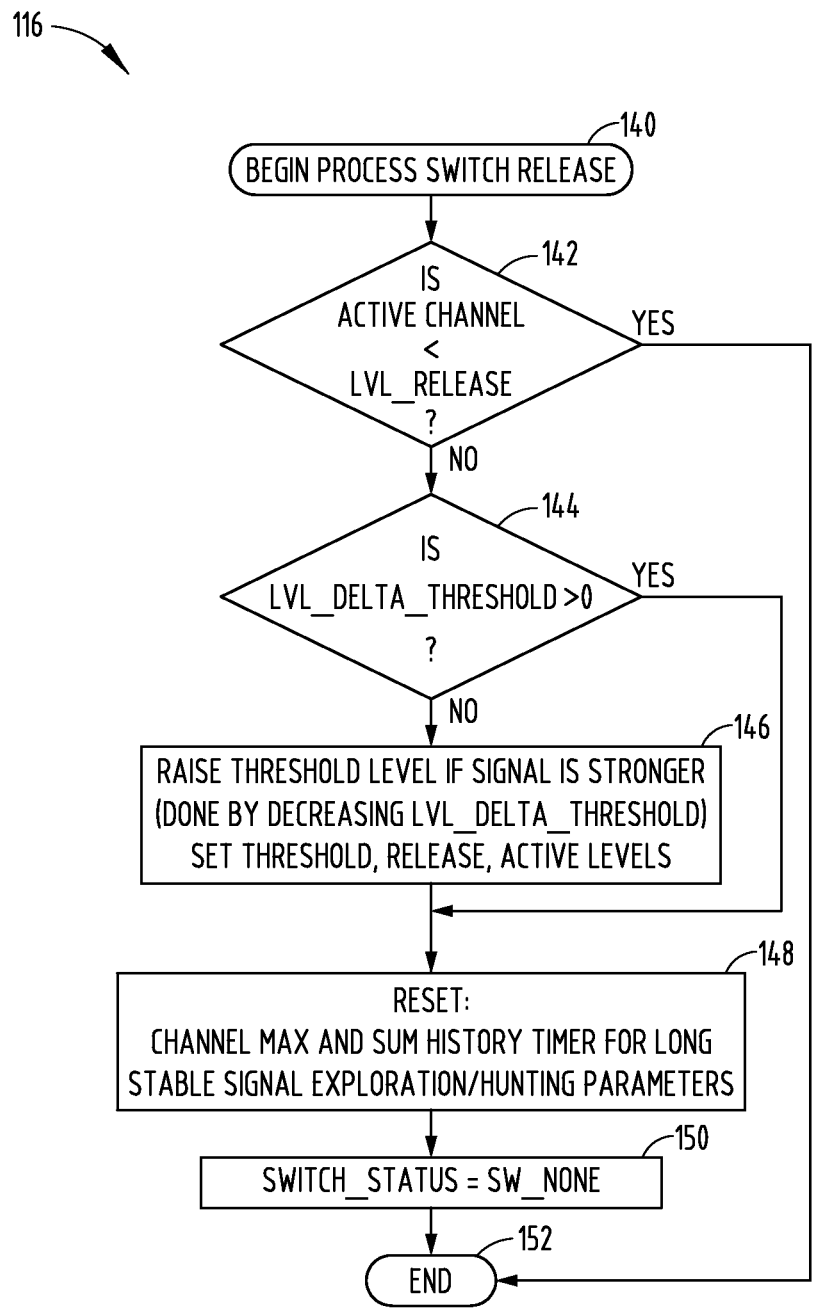
FIG. 16 is a flow diagram illustrating the processing of the switch activation and switch release.

When a switch is active, a process switch release routine is activated which is shown in FIG. 16. The process switch release routine 116 begins at step 140 and proceeds to decision step 142 to determine if the active channel is less than LVL_RELEASE and, if so, ends at step 152. If the active channel is less than the LVL_RELEASE then routine 116 proceeds to decision step 144 to determine if the LVL_DELTA_THRESHOLD is greater than 0 and, if not, proceeds to step 146 to raise the threshold level if the signal is stronger. This may be achieved by decreasing LVL_DELTA_THRESHOLD. Step 146 also sets the threshold, release and active levels. Routine 116 then proceeds to step 148 to reset the channel max and sum history timer for long stable signal hunting/exploration parameters. The switch status is set equal to SW_NONE at step 150 before ending at step 152. To exit the process switch release module, the signal on the active channel has to drop below LVL_RELEASE, which is an adaptive threshold that will change as glove interaction is detected. As the switch button is released, all internal parameters are reset and a lockout timer is started to prevent further activations before a certain waiting time has elapsed, such as 100 milliseconds. Additionally, the threshold levels are adapted in function of the presence of gloves or not.

Figure 17:
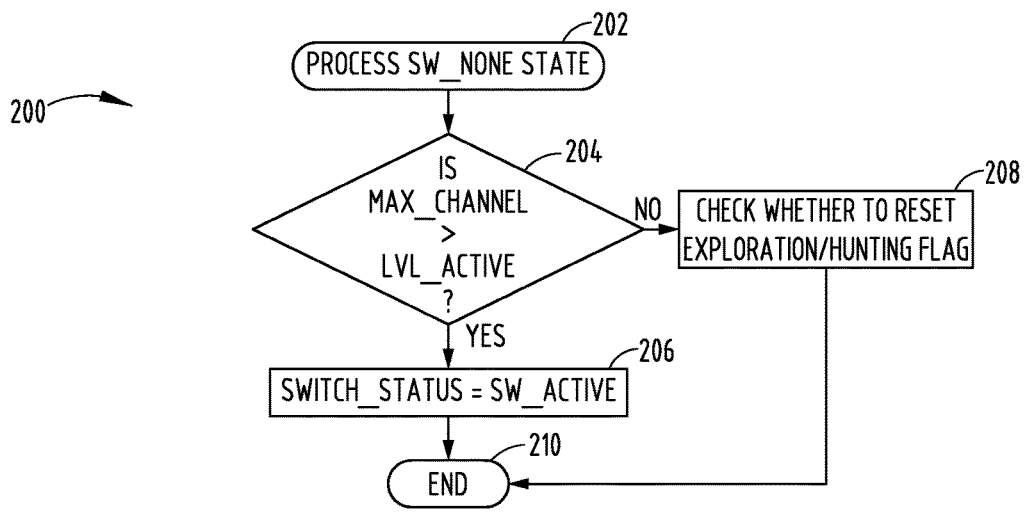
FIG. 17 is a flow diagram illustrating logic for switching between the switch none and switch active states.

Referring to FIG. 17, a routine 200 for determining the status change from SW_NONE state to SW_ACTIVE state is illustrated, according to one embodiment. Routine 200 begins at step 202 to process the SW_NONE state, and then proceeds to decision step 204 to determine if the max_channel is greater than LVL_ACTIVE. If the max_channel is greater than LVL_ACTIVE, then the proximity switch assembly changes state from SW_NONE state to SW_ACTIVE state and ends at step 210. If the max_channel is not greater than LVL_ACTIVE, the routine 200 checks for whether to reset the hunting flag at step 208 prior to ending at step 210. Thus, the status changes from SW_NONE state to SW_ACTIVE state when the max_channel triggers above LVL_ACTIVE. If the channels stays below this level, after a certain waiting period, the hunting flag, if set, gets reset to no hunting, which is one way of departing from the hunting mode.

Figure 18:
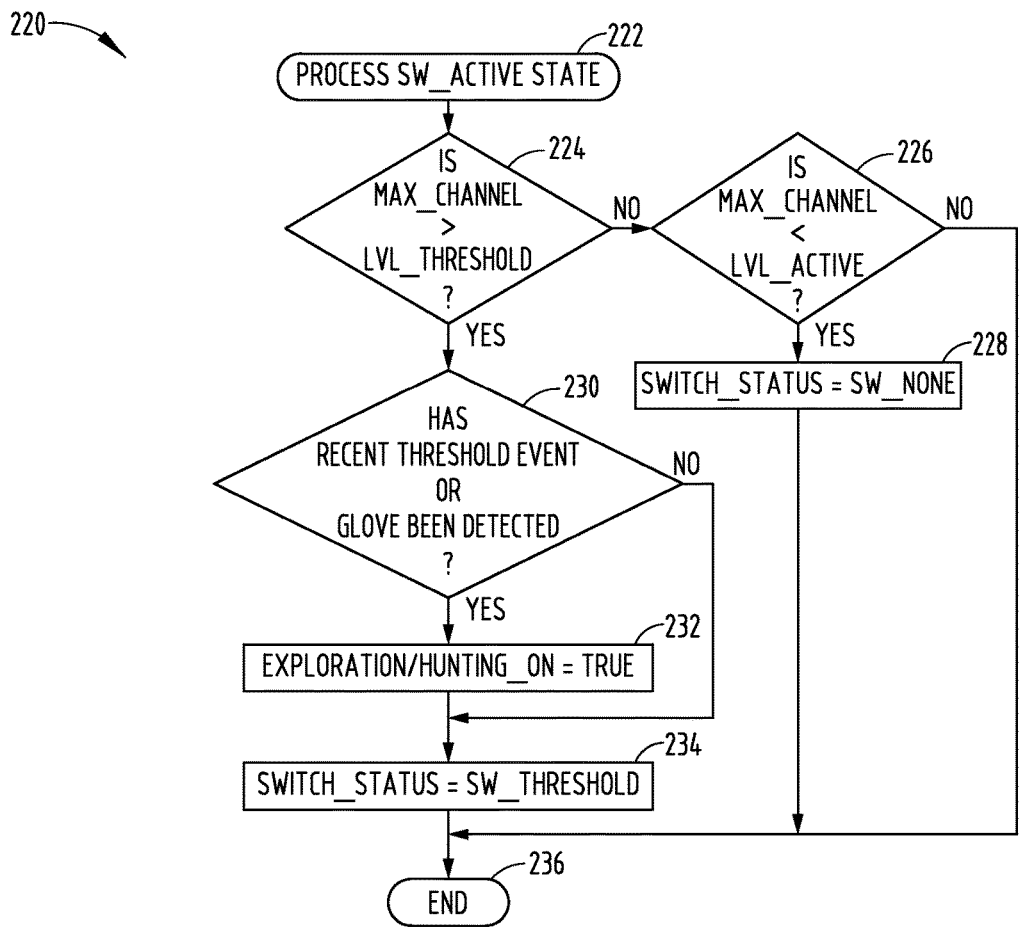
FIG. 18 is a flow diagram illustrating logic for switching from the active switch state to the switch none or switch threshold state.

Referring to FIG. 18, a method 220 for processing the state of the SW_ACTIVE state changing to either SW_THRESHOLD state or SW_NONE state is illustrated, according to one embodiment. Method 220 begins at step 222 and proceeds to decision step 224. If max_channel is not greater than LVL_THRESHOLD, then method 220 proceeds to step 226 to determine if the max_channel is less than LVL_ACTIVE and, if so, proceeds to step 228 to change the switch status to SW_NONE. Accordingly, the status of the state machine moves from the SW_ACTIVE state to SW_NONE state when the max_channel signal drops below LVL_ACTIVE. A delta value may also be subtracted from LVL_ACTIVE to introduce some hysteresis. If the max_channel is greater than the LVL_THRESHOLD, then routine 220 proceeds to decision step 230 to determine if a recent threshold event or a glove has been detected and, if so, sets the hunting on flag equal to true at step 232. At step 234, method 220 switches the status to SW_THRESHOLD state before ending at step 236. Thus, if the max_channel triggers above the LVL_THRESHOLD, the status changes to SW_THRESHOLD state. If gloves are detected or a previous threshold event that did not result in activation was recently detected, then the hunting/exploration mode may be entered automatically.

Figure 19:
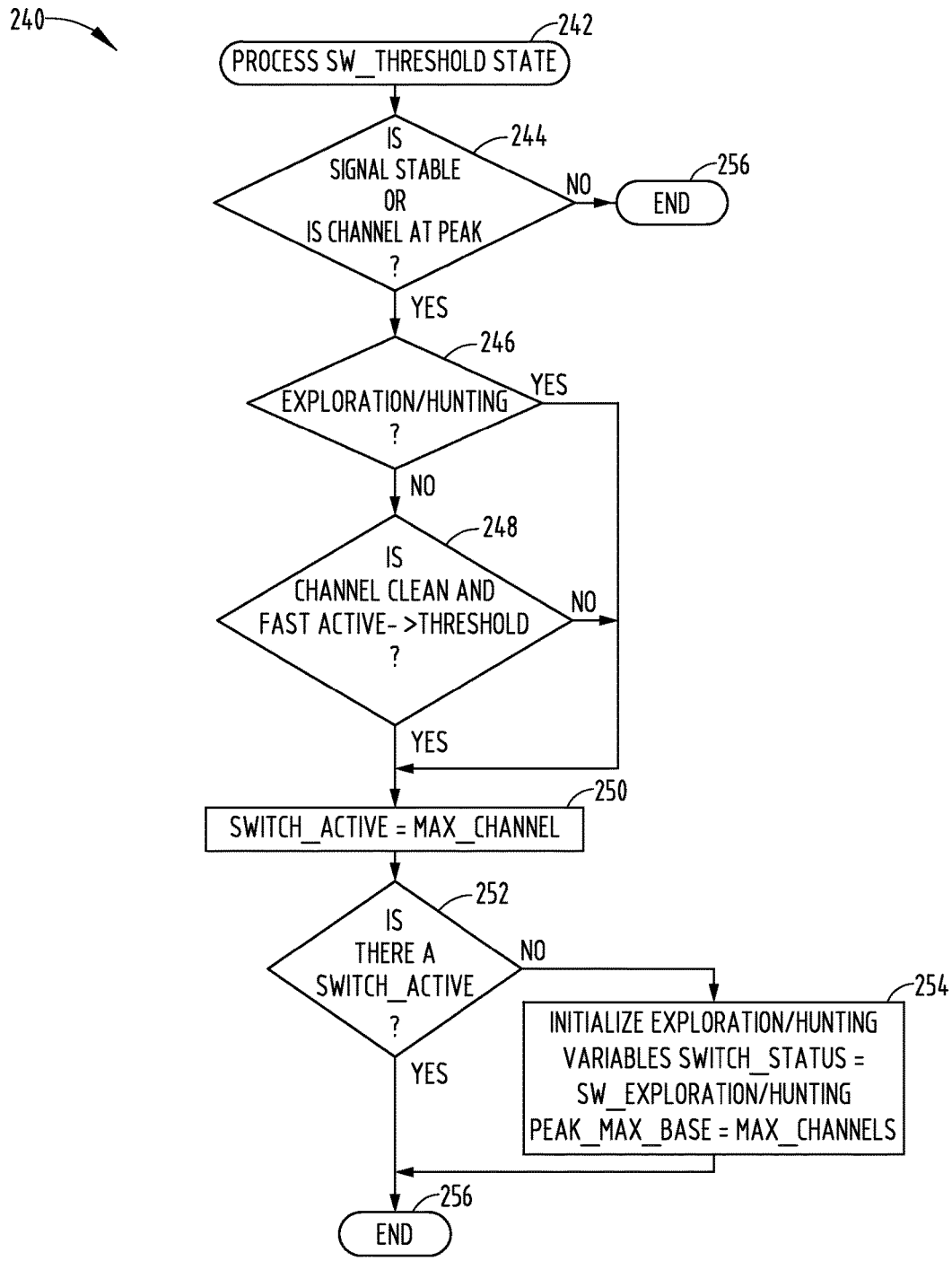
FIG. 19 is a flow diagram illustrating a routine for switching between the switch threshold and switch hunting states.

Referring to FIG. 19, a method 240 of determining activation of a switch from the SW_THRESHOLD state is illustrated, according to one embodiment. Method 240 begins at step 242 to process the SW_THRESHOLD state and proceeds to decision block 244 to determine if the signal is stable or if the signal channel is at a peak and, if not, ends at step 256. If either the signal is stable or the signal channel is at a peak, then method 240 proceeds to decision step 246 to determine if the hunting or exploration mode is active and, if so, skips to step 250. If the hunting or exploration mode is not active, method 240 proceeds to decision step 248 to determine if the signal channel is clean and fast active is greater than a threshold and, if so, sets the switch active equal to the maximum channel at step 250. Method 240 proceeds to decision block 252 to determine if there is a switch active and, if so, ends at step 256. If there is no switch active, method 240 proceeds to step 254 to initialize the hunting variables SWITCH_STATUS set equal to SWITCH_HUNTING and PEAK_MAX_BASE equal to MAX_CHANNELS, prior to ending at step 256.

In the SW_THRESHOLD state, no decision is taken until a peak in MAX_CHANNEL is detected. Detection of the peak value is conditioned on either a reversal in the direction of the signal, or both the MAX_CHANNEL and SUM_CHANNEL remaining stable (bound in a range) for at least a certain interval, such as 60 milliseconds. Once the peak is detected, the hunting flag is checked. If the hunting mode is off, the entry ramp slope method is applied. If the SW_ACTIVE to SW_THRESHOLD was a less than a threshold such as 16 milliseconds, and the signature of noise rejection method indicates it as a valid triggering event, then the state is changed to SWITCH_ACTIVE and the process is transferred to the PROCESS_SWITCH_RELEASE module, otherwise the hunting flag is set equal to true. If the delayed activation method is employed instead of immediately activating the switch, the state is changed to SW_DELAYED_ACTIVATION where a delay is enforced at the end of which, if the current MAX_CHANNEL index has not changed, the button is activated.

Figure 20:
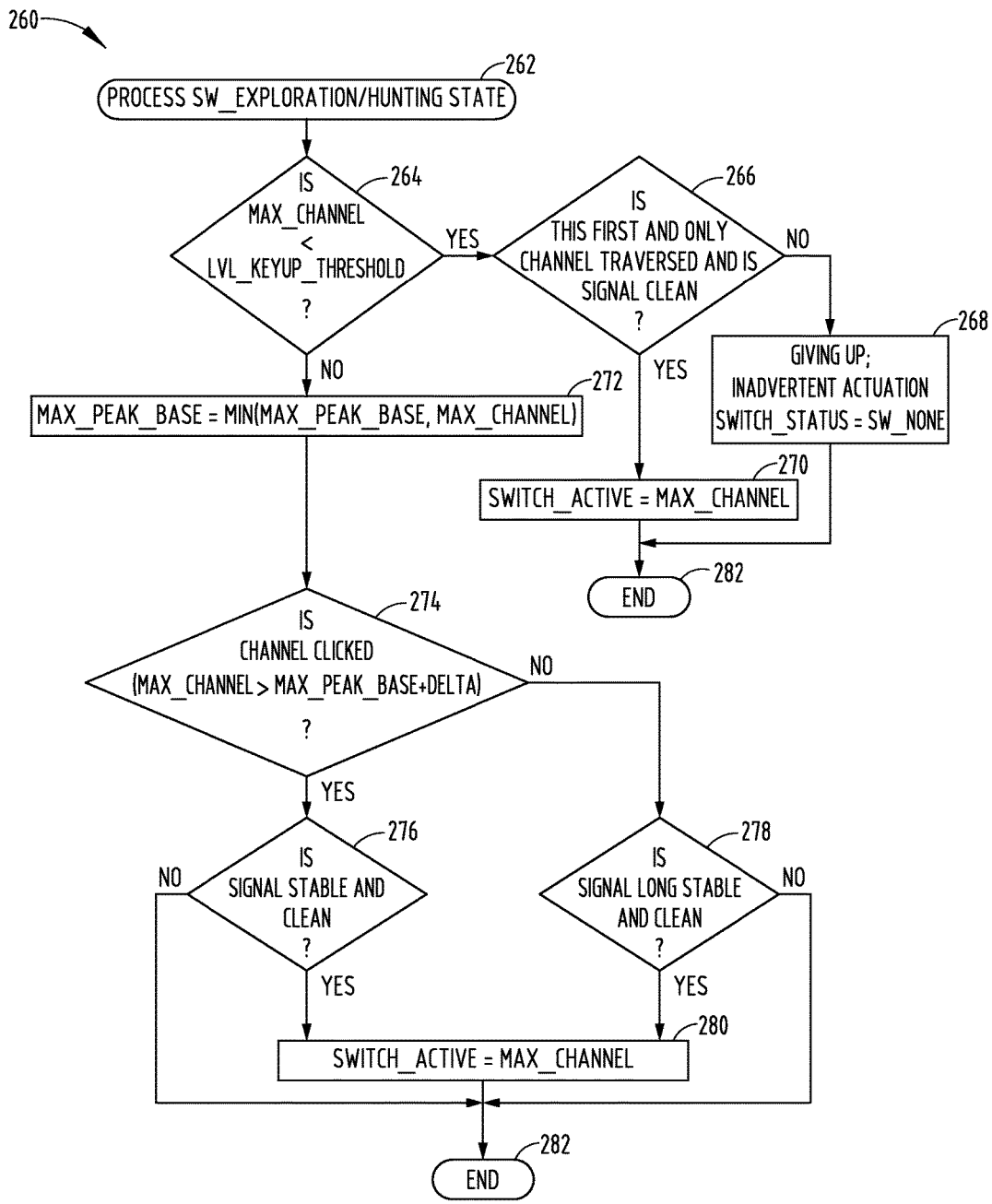
FIG. 20 is a flow diagram illustrating a virtual button method implementing the switch hunting state.

Referring to FIG. 20, a virtual button method implementing the SW_HUNTING state is illustrated, according to one embodiment. The method 260 begins at step 262 to process the SW_HUNTING state and proceeds to decision step 264 to determine if the MAX_CHANNEL has dropped below the LVL_KEYUP_THRESHOLD and, if so, sets the MAX_PEAK_BASE equal to MIN (MAX_PEAK_BASE, MAX_CHANNEL) at step 272. If the MAX_CHANNEL has dropped below the LVL_KEYUP_THRESHOLD, then method 260 proceeds to step 266 to employ the first channel triggering hunting method to check whether the event should trigger the button activation. This is determined by determining if the first and only channel is traversed and the signal is clean. If so, method 260 sets the switch active equal to the maximum channel at step 270 before ending at step 282. If the first and only channel is not traversed or if the signal is not clean, method 260 proceeds to step 268 to give up and determine an inadvertent actuation and to set the SWITCH_STATUS equal to SW_NONE state before ending at step 282.

Following step 272, method 260 proceeds to decision step 274 to determine if the channel clicked. This can be determined by whether MAX_CHANNEL is greater than MAX_PEAK_BASE plus delta. If the channel has clicked, method 260 proceeds to decision step 276 to determine if the signal is stable and clean and, if so, sets the switch active state to the maximum channel at step 280 before ending at step 282. If the channel has not clicked, method 260 proceeds to decision step 278 to see if the signal is long, stable and clean, and if so, proceeds to step 280 to set the switch active equal to the maximum channel before ending at step 282.

The proximity switch assembly 20 may include a virtual button mode, according to another embodiment. Referring to FIGS. 21-27, the proximity switch assembly having a virtual button mode and a method of activating the proximity switch with the virtual button mode is shown therein, according to this embodiment. The proximity switch assembly may include one or more proximity switches each providing a sense activation field and control circuitry for controlling the activation field of each proximity switch to sense activation. The control circuitry monitors signals indicative of the activation fields, determines a first stable amplitude of the signal for a time period, determines a subsequent second stable amplitude of the signal for the time period, and generates an activation output when the second stable signal exceeds the first stable signal by a known amount. The method may be employed by the proximity switch assembly and includes the steps of generating an activation field associated with each of one or more of a plurality of proximity sensors, and monitoring a signal indicative of each associated activation field. The method also includes the steps of determining a first amplitude when the signal is stable for a minimum time period, and determining a second amplitude when the signal is stable for the minimum time period. The method further includes the step of generating an activation output when the second amplitude exceeds the first amplitude by a known amount. As a result, a virtual button mode is provided for the proximity switch that prevents or reduces unintended or false activations which may be caused by a finger exploring a plurality of proximity switch buttons and changing directions or by a finger covered by a glove.

Figure 21:
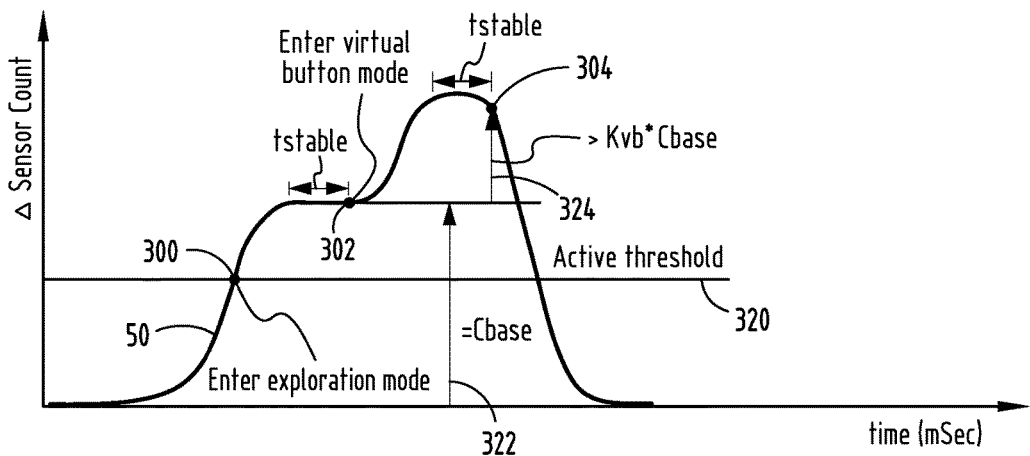
FIG. 21 is a graph illustrating the signal count for a channel associated with a capacitive sensor having an exploration mode and a virtual button mode for activating a switch, according to a further embodiment.

In FIG. 21, the exploration and activation of a proximity switch is shown for one of the signal channels labeled as signal 50 as a user's finger slides across the corresponding switch, enters an exploration mode, and proceeds to activate the switch in the virtual button mode. It should be appreciated that the user's finger may explore a plurality of capacitive switches as illustrated in FIGS. 10-12 in which signals associated with each of the corresponding signal channels are generated as the finger passes through the activation field of each channel. A plurality of signal channels may be processed at the same time and the maximum signal channel may be processed to determine activation of the corresponding proximity switch. In the examples provided in the signal diagrams of FIGS. 21-25, a single signal channel associated with one switch is shown, however, a plurality of signal channels could be processed. The signal 50 associated with one of the signal channels is shown in FIG. 21 rising up to a threshold active level 320 at point 300 at which point the signal enters the exploration mode. The signal 50 thereafter continues to rise and reaches a first amplitude at which point the signal is stable for a minimum time period, shown as Tstable which is shown at point 302. At point 302, the signal 50 enters the virtual button mode and establishes a first base value Cbase which is the delta signal count at point 302. At this point, the virtual button mode establishes an incremental activation threshold as a function of the base value Cbase multiplied by a constant $K_{vb}$. The activation threshold for determining an activation may be represented by: $(1+K_{vb}) \times$ Cbase, wherein $K_{vb}$ is a constant greater than zero. The virtual button mode continues to monitor the signal 50 to determine when it reaches a second stable amplitude for the minimum time period Tstable which occurs at point 304. At this point 304, the virtual button mode compares the second stable amplitude to the first stable amplitude and determines if the second amplitude exceeds the first amplitude by the known amount of $K_{vb} \times$Cbase. If the second amplitude exceeds the first amplitude by the known amount, an activation output for the proximity switch is then generated.

According to this embodiment, a stable signal amplitude must be maintained by the signal channel for at least a minimum time period Tstable prior to entering the virtual button mode or determining activation of the switch. The sensor value as it enters the virtual button mode is recorded as Cbase. The method monitors for when a subsequent stable signal amplitude is achieved again prior to a time-out period. If a stable signal amplitude is achieved again prior to the time-out period expiring with a delta count value greater than a desired percentage, such as 12.5 percent of the prior recorded Cbase, then activation is triggered. According to one embodiment, a percentage delta signal count increase of at least 10 percent is provided by $K_{vb} \times$Cbase.

The multiplier $K_{vb}$ is a factor of at least 0.1 or at least 10 percent of the Cbase value, according to one embodiment. According to another embodiment, the multiplier $K_{vb}$ is set at about 0.125 which equivalent to 12.5 percent. The stable time period Tstable may be set to a time of at least 50 milliseconds, according to one embodiment. According to another embodiment, the stable time period Tstable may be set in the range of 50 to 100 milliseconds. The stable amplitude may be determined by the signal amplitude being substantially stable in a range within twice the size of estimated noise on the signal according to one embodiment, or within 2.5 to 5.0 percent of the signal level, according to another embodiment or a combination of twice the estimated noise of the signal added to 2.5 to 5.0 percent of the signal level, according to a further embodiment.

Figure 22:
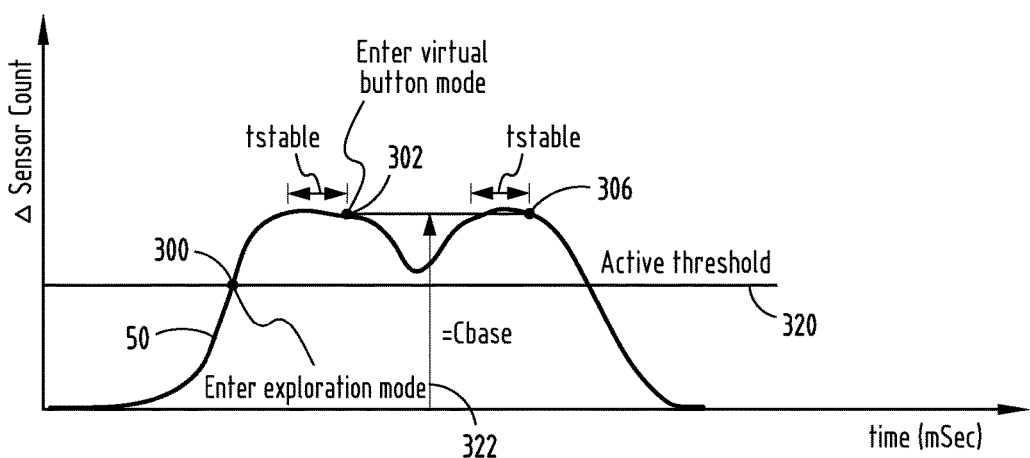
FIG. 22 is a graph illustrating the signal count for the virtual button mode in which an activation is not triggered.

Referring to FIG. 22, a signal 50 for a signal channel associated with a proximity switch is illustrated entering the exploration mode at point 300 and proceeding to a reach a stable first amplitude when the stable signal amplitude exists for a minimum time period Tstable at point 302 in which the virtual button mode is entered. At this point, the Cbase value is determined. Thereafter, the signal 50 is shown dropping and again rising to a second amplitude when the signal is stable for the minimum time period Tstable at point 306. However, in this situation, the second amplitude at point 306 does not exceed the base value Cbase of the signal at point 302 by the known amount of $K_{vb} \times$Cbase, and as a result does not generate an activation output for the switch.

Figure 23:
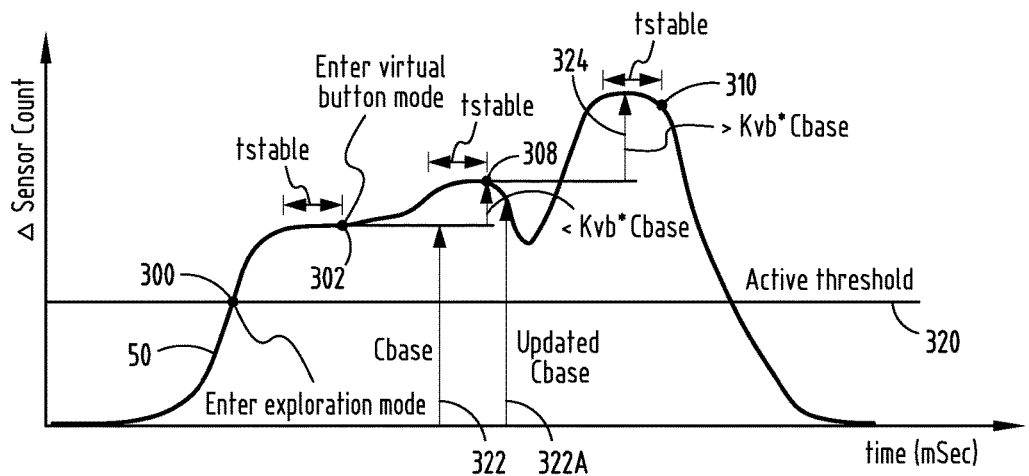
FIG. 23 is a graph illustrating the signal count for the capacitive sensor in the exploration mode further illustrating when the switch is activated, according to the embodiment of FIG. 21.

Referring to FIG. 23, a signal 50 associated with a signal channel is illustrated entering the exploration mode at point 300 and proceeding to reach a first amplitude for a stable time period Tstable at point 302 in which the virtual button mode is entered and Cbase is determined. Thereafter, the signal 50 continues to rise to a second amplitude that is stable for the minimum time period Tstable at point 308. However, at point 308, the second amplitude does not exceed the base value Cbase of the signal established at the first amplitude at point 302 by the known amount of $K_{vb} \times$ Cbase, so the proximity switch assembly does not trigger a switch output. However, a new updated base value is generated for Cbase at point 308 and is used to determine the known amount for comparison with the next stable amplitude. Signal 50 is shown dropping and then rising to a third amplitude that is stable for the minimum time period Tstable at point 310. The third amplitude exceeds the second amplitude by more than the known amount $K_{vb} \times$Cbase such that an activation output for the switch is generated.

Figure 24:
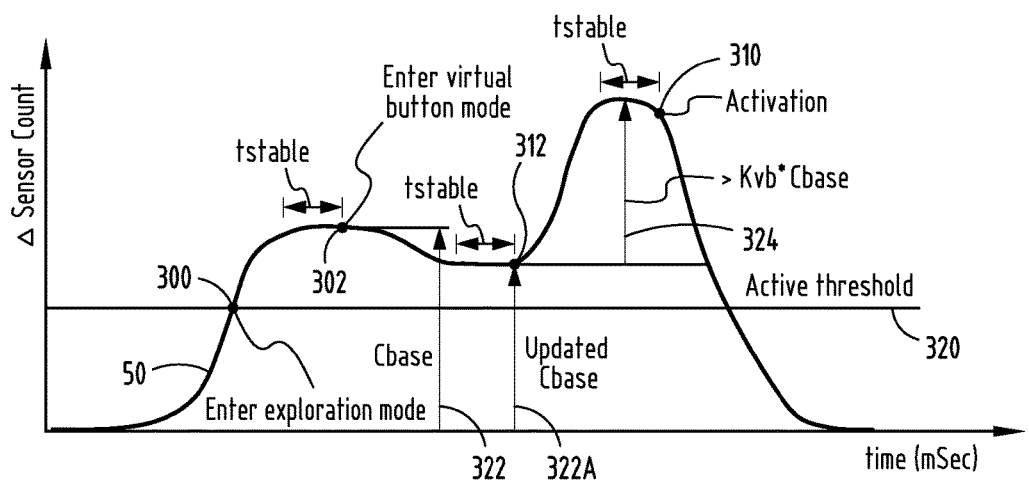
FIG. 24 is a graph illustrating the signal count for a capacitive sensor further illustrating when activations are triggered, according to the embodiment of FIG. 21.

Referring to FIG. 24, another example of a signal 50 is illustrated entering the exploration mode at point 300 and continuing to rise to a first amplitude that is stable for a minimum time period Tstable at point 302 in which the virtual button mode is entered and Cbase is determined. Thereafter, the signal 50 is shown dropping to a second amplitude that is stable for the minimum time period Tstable at point 312. At point 312, the second amplitude does not exceed the first amplitude by the known amount of $K_{vb} \times C_{base}$ such that a trigger of the signal is not generated. However, an updated base value Cbase is generated at point 312. Thereafter, signal 50 continues to rise to a third amplitude that is stable for the minimum time period Tstable at point 310. The third amplitude exceeds the second amplitude by the known amount $K_{vb} \times C_{base}$, such that a trigger or activation output for the switch is generated.

Figure 25:
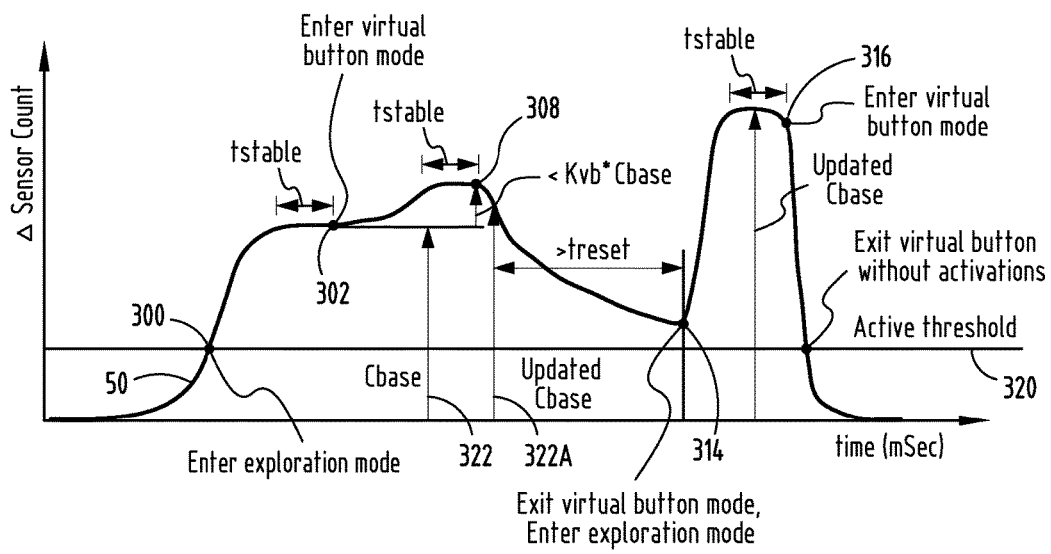
FIG. 25 is a graph illustrating the signal count for a capacitive sensor further illustrating a timeout for exiting the virtual button mode and re-entering the virtual button mode, according to the embodiment of FIG. 21.

Referring to FIG. 25, another example of a signal 50 for a signal channel is shown entering the exploration mode at point 300 and proceeding to reach a first amplitude that is stable for the minimum time period Tstable at point 302 and therefore enters the virtual button mode and determines Cbase. Next, signal 50 continues to rise to a second amplitude that is stable for the time period Tstable at point 308. The second amplitude does not exceed the first amplitude by the known amount such that a trigger of the switch is not generated at this point. Thereafter, signal 50 is shown dropping to point 314 and in the process of doing so, a reset timer times out since the last stable amplitude was received as shown by time Treset. When the reset timer times out, at point 314, the virtual button mode is exited and the exploration mode is entered once the virtual button mode is exited. When this occurs, the prior determined Cbase is no longer valid. Thereafter, signal 50 is shown rising to a third amplitude that is stable for the minimum time period Tstable at point 316. At this point, the third amplitude establishes an updated Cbase which is used for determining future activations of the switch. Thereafter, the signal 50 is further shown dropping below the threshold active value 320, in which case, the virtual button mode is exited without any activations.

Figure 26:
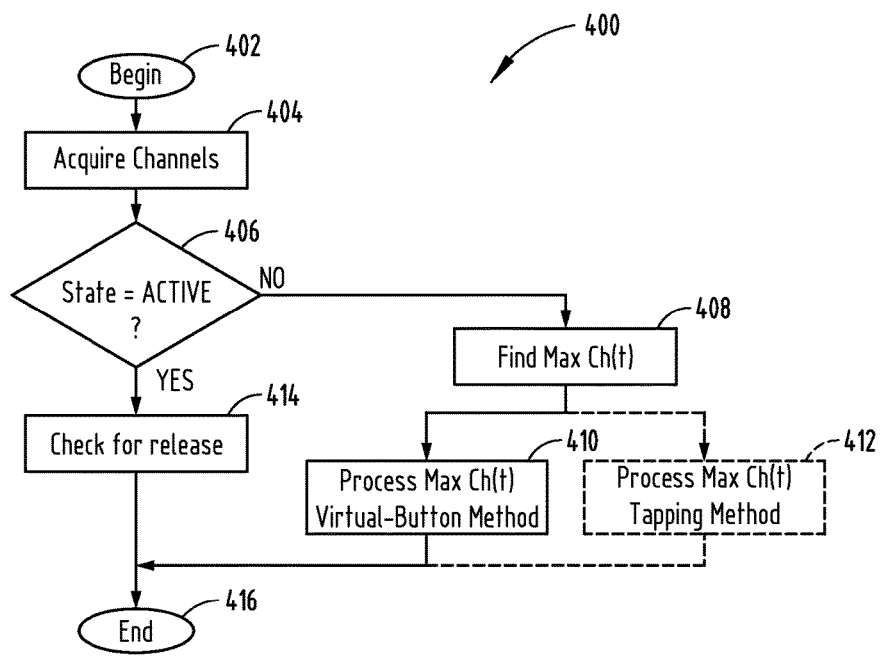
FIG. 26 is a flow diagram illustrating a routine for processing the signal channel with a virtual button mode, according to the embodiment shown in FIG. 21.
Figure 27:
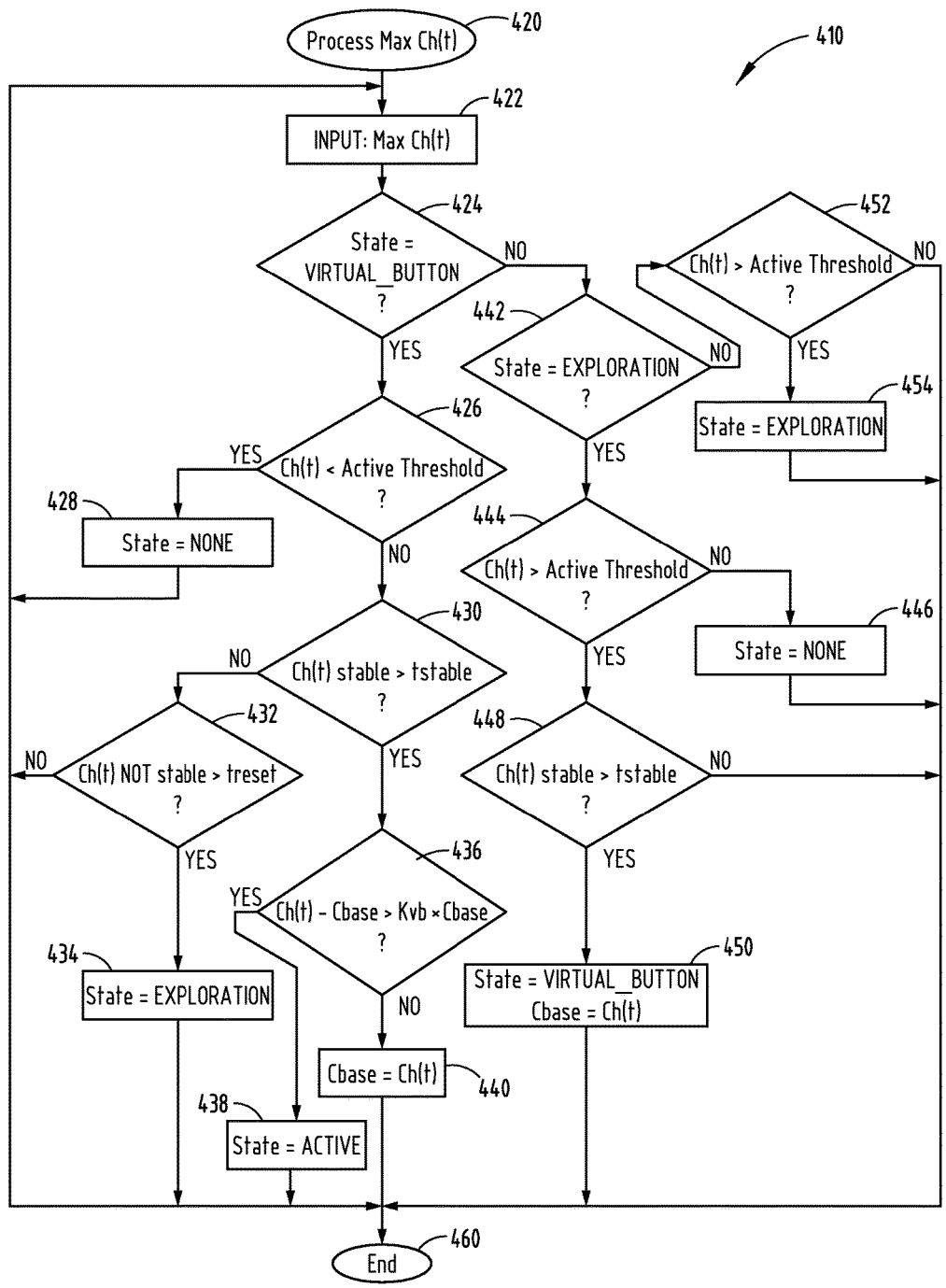
FIG. 27 is a flow diagram illustrating a virtual button method for processing the signal channel, according to the embodiment of FIG. 21.

A method of activating a proximity switch with a virtual button mode using the proximity switch assembly is illustrated in FIGS. 26 and 27. Referring to FIG. 26, method 400 begins at step 402 and proceeds to acquire all signal channels associated with all proximity switches at step 404. Method 400 proceeds to decision block 406 to determine if the state is set in the ACTIVE state and, if so, checks for a release of the switch at step 414 before ending at step 416. If the state is not set to the ACTIVE state, method 400 proceeds to step 408 to find the maximum channel (CHT). Next, once the maximum channel has been found, routine 400 proceeds to step 410 to process the maximum channel (CHT) virtual-button method before ending at step 416. The process maximum channel virtual-button method 410 is illustrated in FIG. 27 and described below. It should be appreciated that method 400 may include an optional step 412 for also processing the maximum channel signal using a tapping method to detect a user tapping on a proximity switch so as to generate an activation output.

The process maximum channel virtual-button method 410 shown in FIG. 27 begins at step 420 and proceeds to step 422 to input the maximum channel signal. Hence, the maximum signal channel associated with one of the proximity switches is processed to determine the virtual button mode state and activation of the switch. At decision step 424, method 410 determines if the switch is set to the virtual button mode state and, if so, proceeds to decision step 426 to determine if the signal channel value is less than the active threshold. If the signal channel is less than the active threshold, method 410 proceeds to step 428 to set the state equal to NONE and returns to the beginning. If the signal channel is not less than the active threshold value, method 410 proceeds to decision step 430 to determine if the signal has a stable first amplitude for a time period greater than the stable time period Tstable. If the stable signal channel at the first amplitude is stable for a time period greater than Tstable, method 410 proceeds to decision step 432 to determine if the signal channel is not stable for a time period exceeding the reset time period Treset and, if not, returns to step 422. If the signal channel is not stable for a time period exceeding the reset time period Treset, method 410 proceeds to set the state equal to the exploration/hunting state and ends at step 460.

Returning to decision step 430, if the signal channel is stable for a time period exceeding the stable time period Tstable, method 410 proceeds to decision step 436 to determine if the signal Ch(t) is greater than Cbase by a known amount defined by $K_{vb} \times C_{base}$ and, if so, sets the switch state to active so as to generate an activation output before ending at step 460. If the signal does not exceed Cbase by the known amount of $K_{vb} \times C_{base}$, method 410 proceeds to set the new Cbase value at the current stable signal amplitude at step 440, before ending at step 460.

Returning to decision step 424, if the switch state is not set to the virtual button mode, method 410 proceeds to decision step 442 to determine if the state is set to the exploration state and, if so, proceeds to decision step 444 to determine if the signal is greater than the active threshold and, if not, sets the state equal to the NONE state and ends at step 460. If the signal is greater than the active threshold, method 410 proceeds to decision step 448 to determine if the signal is stable at an amplitude for a time period exceeding the minimum time period Tstable and, if not, ends at step 460. If the signal is stable at an amplitude for a time period exceeding the minimum time period Tstable, method 410 proceeds to step 450 to set the state for the switch to the virtual button state and to establish the new Cbase value for the signal channel at step 450 before ending at step 460.

Returning to decision step 442, if the state of the switch is not set to the exploration/hunting state, method 410 proceeds to decision step 452 to determine if the signal is greater than the active threshold and, if not, ends at step 460. If the signal is greater than the active threshold, method 410 proceeds to decision step 454 to set the state to the exploration/hunting state before ending at step 460.

Accordingly, the proximity switch assembly having the virtual button method 410 advantageously provides for enhanced virtual button switch activation detection and improved rejection of unintended activations. Method 410 may advantageously detect an activation of a switch while rejecting unintended activations which may be detected when a finger explores the switch assembly and reverses direction or in which the user's finger is wearing a glove. The enhanced activation detection advantageously provides for enhanced proximity switch assembly.

Accordingly, the determination routine advantageously determines activation of the proximity switches. The routine advantageously allows for a user to explore the proximity switch pads which can be particularly useful in an automotive application where driver distraction can be avoided.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A method of activating a proximity switch, comprising:
generating an activation field associated with a proximity sensor;
monitoring a signal indicative of the activation field;
determining a first amplitude when the signal is stable for a minimum time period due to a user touch interaction;
determining a subsequent second amplitude when the signal is stable for the minimum time period during the same user touch interaction; and
generating an activation output when the second amplitude exceeds the first amplitude by a known amount.

2. The method of claim 1 further comprising the step of detecting sliding of an object in an exploration mode prior to determining the first and second amplitudes.

3. The method of claim 1, wherein the time period is at least 50 milliseconds.

4. The method of claim 3, wherein the time period is in the range of 50 to 100 milliseconds.

5. The method of claim 1, wherein the known amount comprises at least 110% of the first amplitude.

6. A method of activating a proximity switch, comprising:
generating an activation field associated with a proximity sensor;
monitoring a signal indicative of the activation field;
determining a first amplitude when the signal is stable for a minimum time period due to user interaction;
determining a subsequent second amplitude when the signal is stable for the minimum time period; and
generating an activation output when the second amplitude exceeds the first amplitude by a known amount, wherein, if the second amplitude does not exceed the first amplitude by the known amount, the method further determines when the signal is stable at a third amplitude, and when the third amplitude exceeds the second amplitude by the known amount, the activation output is generated.

7. The method of claim 1 further comprising monitoring time since the first stable amplitude and requiring determination of another stable amplitude before expiration of the reset time prior to generating the activation output.

8. The method of claim 1, wherein the signal comprises a change in sensor count associated with an activation field.

9. The method of claim 1, wherein the proximity switch is installed on a vehicle for use by a passenger in the vehicle.

10. The method of claim 1, wherein the proximity switch comprises a capacitive switch comprising one or more capacitive sensors.

11. The method of claim 1, wherein the method generates an activation field for each of a plurality of proximity sensors and monitors a signal indicative of each activation field and determines the first and second amplitude of the signal having the largest value.

12. A method of activating a proximity switch, said method comprising:
generating a plurality of activation fields with a plurality of proximity sensors;
monitoring signals indicative of the activation fields;
detecting sliding of a user's finger based on multiple signals and entering an exploration mode;
determining a first stable amplitude of one of the signals for a time period due to a user touch interaction;
determining a second stable amplitude of the one of the signals for the time period during the same user touch interaction; and
generating an activation field when the second stable amplitude exceeds the first stable amplitude by a known amount.

13. The method of claim 12, wherein the proximity switch is installed on a vehicle for use by a passenger in the vehicle.

14. The method of claim 12, wherein the proximity switch comprises a capacitive switch comprising one or more capacitive sensors.

15. The method of claim 12 wherein the time period is at least 50 milliseconds.

16. The method of claim 15, wherein the time period is in the range of 50 to 100 milliseconds.

17. A proximity switch assembly comprising:
a plurality of proximity switches each providing a sense activation field; and
control circuitry monitoring signals indicative of the activation fields, determining a first stable amplitude of a signal for a time period due to a user touch interaction, determining a subsequent second stable amplitude of the signal for the time period during the same user touch interaction, and generating an activation output for a proximity switch when the second stable signal exceeds the first stable signal by a known amount.

18. The proximity switch assembly of claim 17, wherein the plurality of proximity switches are installed on a vehicle for use by a passenger in the vehicle.

19. The proximity switch assembly of claim 18, wherein the proximity switches comprises capacitive switches comprising one or more capacitive sensors.

20. The proximity switch assembly of claim 17, wherein the control circuitry determines the signal as the largest of the monitored signals, and wherein, if the second amplitude does not exceed the first amplitude by the known amount, the control circuitry determines when the signal is stable at a third amplitude, and when the third amplitude exceeds a second amplitude by the known amount, the activation output is generated.

* * * * *